(12) United States Patent
Hori et al.

(10) Patent No.: US 7,769,067 B2
(45) Date of Patent: Aug. 3, 2010

(54) VERTICAL CAVITY SURFACE EMITTING LASER DEVICE

(75) Inventors: Yuichiro Hori, Yokohama (JP);
Mamoru Uchida, Yokohama (JP);
Kobei Okamoto, Menlo Park, CA (US);
Yasuhiro Nagatomo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 4 days.

(21) Appl. No.: 12/185,231

(22) Filed: Aug. 4, 2008

(65) Prior Publication Data
US 2008/0298419 A1 Dec. 4, 2008

Related U.S. Application Data

(60) Division of application No. 11/500,995, filed on Aug. 9, 2006, now Pat. No. 7,483,466, which is a continuation-in-part of application No. 11/411,113, filed on Apr. 26, 2006, now abandoned.

(30) Foreign Application Priority Data

| Apr. 28, 2005 | (JP) | ............................. 2005-130718 |
| Apr. 28, 2005 | (JP) | ............................. 2005-131643 |
| Aug. 11, 2005 | (JP) | ............................. 2005-233776 |
| Feb. 28, 2006 | (JP) | ............................. 2006-052935 |

(51) Int. Cl.
*H01S 5/00* (2006.01)

(52) U.S. Cl. .............................. 372/50.11; 372/46.016; 372/50.124

(58) Field of Classification Search .............. 372/50.11, 372/46.016, 50.124
See application file for complete search history.

(56) References Cited

U.S. PATENT DOCUMENTS

| 5,249,244 A | 9/1993 | Uchida |
| 5,613,020 A | 3/1997 | Uchida et al. |
| 5,757,832 A | 5/1998 | Uchida |
| 6,031,860 A | 2/2000 | Nitta et al. |
| 6,043,104 A | 3/2000 | Uchida et al. |
| 6,075,799 A | 6/2000 | Uchida et al. |

(Continued)

FOREIGN PATENT DOCUMENTS

CN 1507684 6/2004

(Continued)

OTHER PUBLICATIONS

H.Y. Kim, et al., "Simulations of the Effect of the Core Ring on Surface and Air-Core Modes in Photonic Bandgap Fibers", *Optics Express*, vol. 12, No. 15, p. 3436-3442 (Jul. 26, 2004).

(Continued)

*Primary Examiner*—Dung T Nguyen
(74) *Attorney, Agent, or Firm*—Fitzpatrick, Cella, Harper & Scinto

(57) ABSTRACT

A vertical cavity surface emitting laser device includes a first reflective mirror layer, a second reflective mirror layer, and an active layer disposed therebetween, wherein at least one of the first reflective mirror layer and the second reflective mirror layer includes a periodic-refractive-index structure in which the refractive index periodically changes in the in-plane direction and a part of the periodic-refractive-index structure includes a plurality of parts that disorder the periodicity.

16 Claims, 15 Drawing Sheets

U.S. PATENT DOCUMENTS

| | | |
|---|---|---|
| 6,154,480 A | 11/2000 | Magnusson et al. |
| 6,810,056 B1 | 10/2004 | Lipson et al. |
| 6,829,281 B2 | 12/2004 | Deng et al. |
| 7,120,325 B1 | 10/2006 | Uchida |
| 2002/0163947 A1* | 11/2002 | Ostergaard et al. ............ 372/43 |
| 2004/0013157 A1 | 1/2004 | Deng et al. |
| 2006/0120414 A1 | 6/2006 | Hori |
| 2007/0121694 A1 | 5/2007 | Okamoto |

FOREIGN PATENT DOCUMENTS

| | | |
|---|---|---|
| JP | 2003-114348 | 4/2003 |
| JP | 2004-521499 | 7/2004 |
| JP | 2004-230654 | 8/2004 |
| WO | WO 02/073753 | 9/2002 |
| WO | WO 2004/105094 | 12/2004 |

OTHER PUBLICATIONS

V. Lousse, et al., "Angular and Polarization Properties of a Photonic Crystal Slam Mirror" *Optics Express*, vol. 12, No. 8, pp. 1575-1582 (Apr. 19, 2004).

K. Okamoto, Fundamentals of Optical Waveguides, Academic Press, 2006, Chapter 2.

\* cited by examiner

VERTICAL CAVITY SURFACE EMITTING LASER DEVICE

This application is a divisional of U.S. patent application Ser. No. 11/500,995, filed Aug. 9, 2006, now U.S. Pat. No. 7,483,466, which is a continuation-in-part of U.S. patent application Ser. No. 11/411,113, filed Apr. 26, 2006, which is now abandoned.

BACKGROUND OF THE INVENTION

1. Field of the Invention

The present invention relates to a vertical cavity surface emitting laser (VCSEL).

2. Description of the Related Art

Vertical cavity surface emitting lasers are advantageous in terms of their low threshold value, ease of coupling with optical elements, possibility of formation of an array, and the like. Therefore, the VCSELs have been actively studied since the latter half of 1980's.

However, the VCSELs are disadvantageous in that the spot size with which the VCSELs can oscillate in the single transverse mode is small, about 3 to 4 μm in diameter. The reason for this is as follows. When a VCSEL oscillates in the multi-mode, the responses for an optical element such as a lens are different from each other in each mode, and the emitted light does not behave in the same manner.

Furthermore, since the gain region of the VCSEL is small, a pair of distributed Bragg reflector (DBR) mirrors constituting a resonator must have a high reflectance of 99% or more. In order to achieve such a high reflectance, a multilayer film composed of several tens of layers is necessary in a semiconductor mirror. In such a case, heat is easily accumulated in the resonator because of the large layer thickness of the multilayer film. The unsatisfactory heat dissipation effect increases the threshold value and the electrical resistance, resulting in a difficulty of current injection and the like.

Fan et al. have reported the wavelength dependence of reflected light and transmitted light, etc., when a two-dimensional photonic crystal slab is used as a mirror (V. Lousse et al., Opt. Express, Vol. 12, No. 15, p. 3436 (2004)).

A photonic crystal has a structure in which a refractive index modulation of the order of a predetermined wavelength of light is artificially provided in a material. In other words, in the photonic crystal structure, media having refractive indices different from each other are arrayed with a periodicity. It is believed that the propagation of light in the crystal can be controlled by the multiple scattering effect of the light.

According to the report described in the paper by Fan et al., when light is incident on a surface of a two-dimensional photonic crystal from a direction substantially perpendicular to the surface, light having a predetermined frequency is reflected with an efficiency of about 100%.

For this reason, the present inventors have studied the use of a photonic crystal as a mirror layer of a VCSEL.

SUMMARY OF THE INVENTION

By using a photonic crystal mirror as a reflective mirror of a VCSEL, a mirror composed of a multilayer film having a large thickness of about several micrometers can be replaced by a mirror composed of a very thin film having a thickness of the order of several tens to several hundreds of nanometers. Consequently, the thermal problem due to the thickness of the reflective mirror layer can be suppressed.

However, when the spot size of the emitted light is increased to, for example, 5 μm or more, the VCSEL cannot oscillate in the single transverse mode. In other words, an increase in the spot size causes a state that resembles a plurality of lasers having different phases independently emitting light. This problem becomes critical when the VCSEL is applied to light condensing with a lens.

The present invention provides a novel VCSEL structure that can easily oscillate in the single transverse mode.

According to a first aspect, the present invention relates to a vertical cavity surface emitting laser device comprising a first reflective mirror, a second reflective mirror having a periodic-refractive-index structure in which the refractive index periodically changes in the in-plane direction of a plane opposing the first reflective mirror, and an active layer disposed between the first reflective mirror and the second reflective mirror. The periodic-refractive-index structure includes a plurality of parts that disorder the periodicity of the periodic-refractive-index structure of the second reflective mirror. The periodic-refractive-index structure can be a two-dimensional photonic crystal structure. In addition, a defect level is present within a photonic bandgap of the two-dimensional photonic crystal structure corresponding to the parts that disorder the periodicity of the periodic-refractive-index structure. Further, the parts that disorder the periodicity of the periodic-refractive-index structure are positioned periodically or aperiodically in the in-plane direction of the second reflective mirror. Also, the parts that disorder the periodicity of the periodic-refractive-index structure include light-emitting parts that are optically coupled with each other. In this embodiment, the vertical cavity surface emitting laser device emits light in the single transverse mode.

In one embodiment, the first reflective mirror, the active layer, and the second reflective mirror having the periodic-refractive-index structure are disposed on a substrate in that order and the first reflective mirror comprises a multilayer film. In another embodiment, the second reflective mirror, the active layer, and the first reflective mirror are disposed on a substrate in that order and the first reflective mirror comprises a multilayer film. In still another embodiment, the first reflective mirror, the active layer, and the second reflective mirror having the periodic-refractive-index structure are disposed on a substrate in that order and both the first reflective mirror and the second reflective mirror comprise a two-dimensional photonic crystal. In a further embodiment, the first reflective mirror, the active layer, the second reflective mirror having the periodic-refractive-index structure, and an electrode are disposed on a substrate in that order and the periodic-refractive-index structure is not provided in a part of the second reflective mirror disposed directly under the electrode. The second reflective mirror comprises a plurality of layers each having a periodic-refractive-index structure. In one embodiment, the periodic-refractive-index structure comprises a first medium and a second medium, the second medium having a refractive index higher than that of the first medium, and the device further comprises a layer comprising a medium having a refractive index lower than that of the second medium disposed between the second reflective mirror having the periodic-refractive-index structure and the active layer. The first reflective mirror can be a distributed Bragg reflector mirror comprising a multilayer film. In addition, the interval between the parts that disorder the periodicity of the periodic-refractive-index structure is set so that the parts that disorder the periodicity serve as light-emitting parts and light components in each of the parts that disorder the periodicity are coupled with each other. In one embodiment, the periodic-refractive-index structure comprises a first area in which the parts that disorder the periodicity are disposed and a second area in which the parts that disorder the periodicity are not disposed, and the second area is positioned so as to surround the first area. In this case, the first area comprises a square lattice and the second area comprises a triangular lattice. Also, the periodic-refractive-index structure comprises a two-dimensional photonic crystal and the parts that disorder the periodicity are defects.

According to a second aspect, the present invention relates to a vertical cavity surface emitting laser device comprising a substrate, a first reflective mirror, an active layer, and a second reflective mirror. The first reflective mirror, the active layer, and the second reflective mirror are provided on the substrate. The first reflective mirror and the second reflective mirror comprise a two-dimensional periodic-refractive-index structure. In addition, the laser device emits light in a single transverse mode.

According to a third aspect, the present invention relates to a vertical cavity surface emitting laser device comprising a substrate, a first reflective mirror, an active layer, and a second reflective mirror. The first reflective mirror, the active layer, and the second reflective mirror are provided on the substrate. At least one of the first reflective mirror and the second reflective mirror comprises a two-dimensional periodic-refractive-index structure. The spot size of the emitted laser light emitted from the vertical cavity surface emitting laser device is 5 μm or more. The emitted laser light is emitted in a single transverse mode.

According to a fourth aspect, the present invention relates to a vertical cavity surface emitting laser device comprising a substrate, a first reflective mirror, an active layer, and a second reflective mirror. The first reflective mirror, the active layer, and the second reflective mirror are provided on the substrate. At least one of the first reflective mirror and the second reflective mirror comprises a two-dimensional periodic-refractive-index structure. In the two-dimensional periodic-refractive-index structure, in a wavelength range from 5 to 50 nm, the difference between the reflectance at the resonance wavelength and the reflectance at any other wavelength within the wavelength range is within 3%, the wavelength range including the resonance wavelength. In this embodiment, the light emitted from the vertical cavity surface emitting laser device is emitted in a single transverse mode. In addition, within the wavelength range of 5 to 50 nm, there is a 30 nm wavelength subrange for which the difference between the reflectance at the resonance wavelength and the reflectance at any other wavelength within that 30 nm wavelength subrange is within 3%, the 30 nm wavelength subrange including the resonance wavelength.

According to the present invention, a novel structure of a VCSEL that can easily oscillate in the single transverse mode even with an increased spot size can be provided.

Further features of the present invention will become apparent from the following description of exemplary embodiments with reference to the attached drawings.

DESCRIPTION OF THE EMBODIMENTS

A basic structure of a vertical cavity surface emitting laser (VCSEL) according to the present invention will now be described with reference to FIG. 1.

Figure 1:
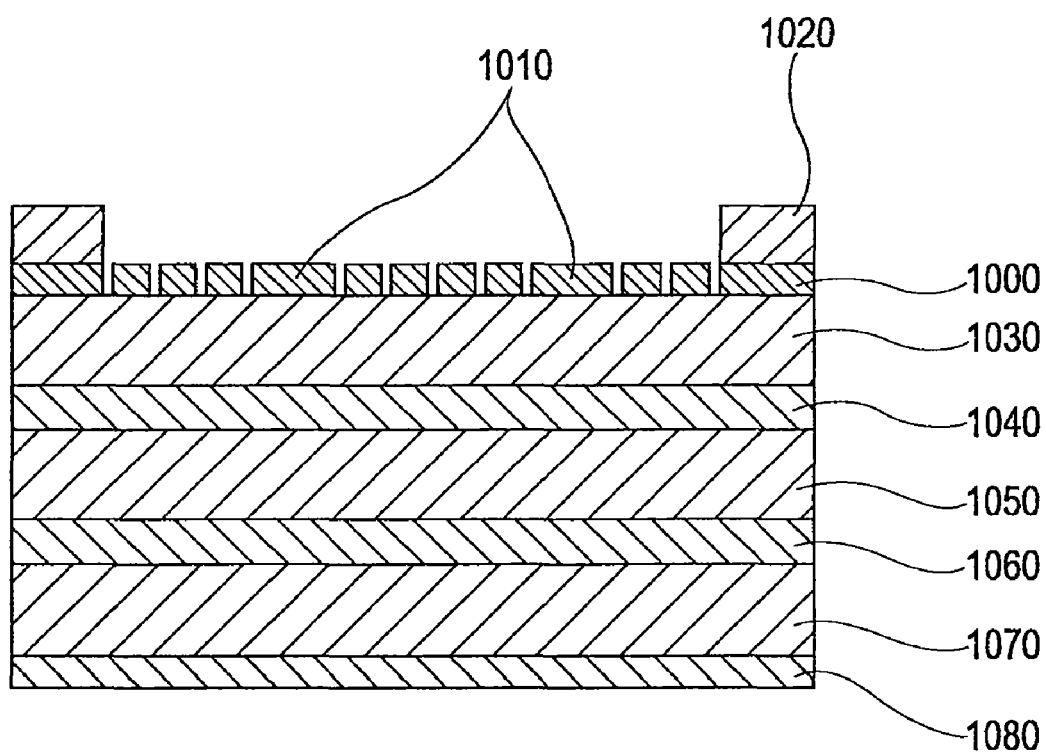
FIG. 1 is a schematic cross-sectional view of a laser device including a two-dimensional photonic crystal according to the present invention.

FIG. 1 is a schematic cross-sectional view of a VCSEL according to the present invention. In the figure, the VCSEL includes an active layer 1040, spacer layers 1030 and 1050 (also referred to as cladding layers) that sandwich the active layer 1040, electrodes 1020 and 1080, a second reflective mirror layer 1000, a first reflective mirror layer 1060, and a substrate 1070.

In FIG. 1, a periodic-refractive-index structure is provided in the second reflective mirror layer 1000. The periodic-refractive-index structure includes parts 1010 that disorder the periodicity. In photonic crystals, such a part that disorders the periodicity is referred to as a defect in some cases.

The parts that disorder the periodicity of the periodic-refractive-index structure can be periodically or aperiodically positioned in the in-plane direction of the first or second reflective mirror layer.

The interval between the parts that disorder the periodicity of the periodic-refractive-index structure may be determined, for example, so that the parts that disorder the periodicity serve as light-emitting parts and light components in each of the parts that disorder the periodicity are coupled with each other.

Furthermore, the first or second reflective mirror layer that has a periodic-refractive-index structure may include a periodic-refractive-index structure composed of a plurality of layers.

The periodic-refractive-index structure may include a first medium and a second medium, the second medium having a refractive index higher than that of the first medium. In such a case, a layer that contains a medium having a refractive index lower than that of the second medium may be provided between the first or second reflective mirror layer that has the periodic-refractive-index structure and the active layer.

One of the first and second reflective mirror layers may include the periodic-refractive-index structure and the other reflective mirror layer may be a DBR mirror composed of a multilayer film.

The present invention will now be described in detail.

A periodic-refractive-index structure means a photonic crystal. First, the photonic crystal will be described and defect parts, which are a feature of the present invention, will then be described.

(Photonic Crystal)

A periodic-refractive-index structure (photonic crystal) can be classified as either a one-dimensional structure, a two-dimensional structure, or a three-dimensional structure from the viewpoint of the periodicity of the refractive index. A multilayer film mirror used for VCSELs has a one-dimensional periodic structure. Since two-dimensional photonic crystals (having a periodic structure in which the refractive index in the in-plane direction of the structure is periodically changed) can be prepared relatively easily, compared with three-dimensional photonic crystals, the two-dimensional photonic crystals have been studied most actively heretofore.

Photonic crystals are structures in which a periodic structure of refractive index is artificially provided. In particular, structures in which a periodicity of refractive index in the periodic structure is provided in a direction of a plane formed by two axes in space coordinates or provided only in two directions that are orthogonal with respect to each other are referred to as two-dimensional photonic crystals. There is no periodical change in refractive index in another direction.

In a known form of two-dimensional photonic crystals, a periodic-refractive-index structure is provided on a thin flat plate material so as to have a periodicity in the in-plane direction. Such crystals are particularly referred to as two-dimensional photonic crystal slabs.

Figure 2:
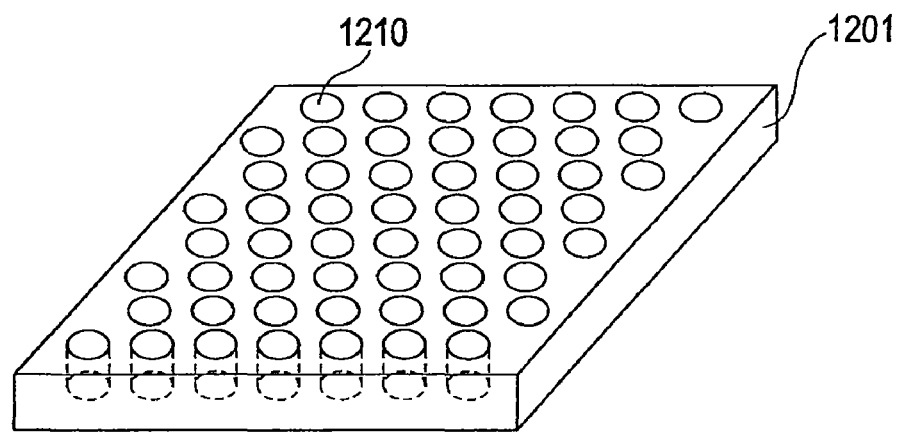
FIG. 2 is a perspective view of a two-dimensional photonic crystal.

For example, as shown in FIG. 2, minute holes 1210 are formed on a thin flat plate 1201, which is a semiconductor composed of Si or the like and having a high refractive index, with a period approximately corresponding to the wavelength of light to be used. Thus, the refractive index can be modulated in the in-plane direction.

Figure 3:
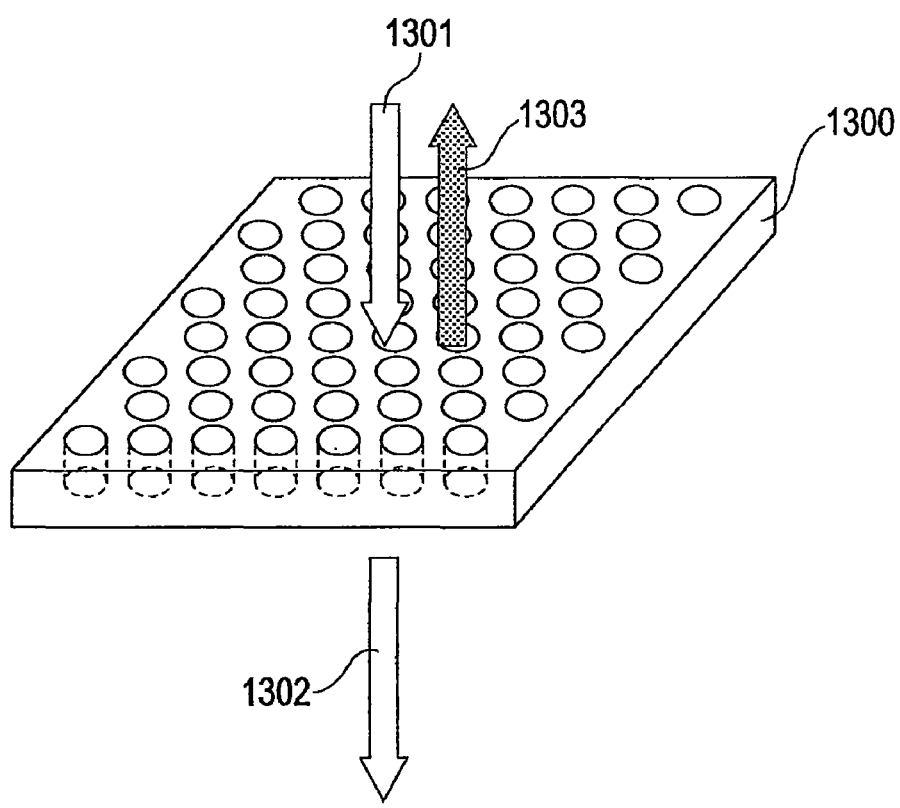
FIG. 3 is a perspective view of a two-dimensional photonic crystal.

As shown in FIG. 3, when light is incident on a two-dimensional photonic crystal 1300 from a direction substantially perpendicular to the plane (incident light 1301, transmitted light 1302, and reflected light 1303 are shown in the figure), the transmission spectra have a complex shape. For example, the above-described document (V. Lousse et al., Opt. Express, Vol. 12, No. 15, p. 3436 (2004)) theoretically describes the fact that the reflectance becomes 100% in three regions at wavelengths of about 1,100 nm, 1,220 to 1,250 nm, and 1,350 nm. Furthermore, the document also describes an experiment in the infrared region that demonstrates that the reflectance substantially becomes about 100% as in the above theory. It is known that the frequency of light to be reflected can be controlled by designing the crystal structure using a numerical simulation by a finite difference time domain (FDTD) method. Despite the presence of such a periodic-refractive-index structure in the in-plane direction, light incident on the structure from the vertical direction is reflected. This phenomenon is known as in-plane guided resonance. For example, the in-plane guided resonance is described in detail in Physical Review B, Volume 65, 235112. In the present invention, a reflective function of a mirror constituting a VCSEL is achieved using this in-plane guided resonance.

Such a phenomenon is based on the fact that light 1301 incident on the two-dimensional photonic crystal from a substantially perpendicular direction is temporarily converted into light guided in the in-plane direction of the photonic crystal, the guided light causes resonance in the in-plane direction, and the light is emitted again in the perpendicular direction of the side of the incident light. This phenomenon will be described with a dispersion relationship (referred to as a "photonic band") between energy of light guided in the two-dimensional photonic crystal and a kinetic momentum.

Figure 4:
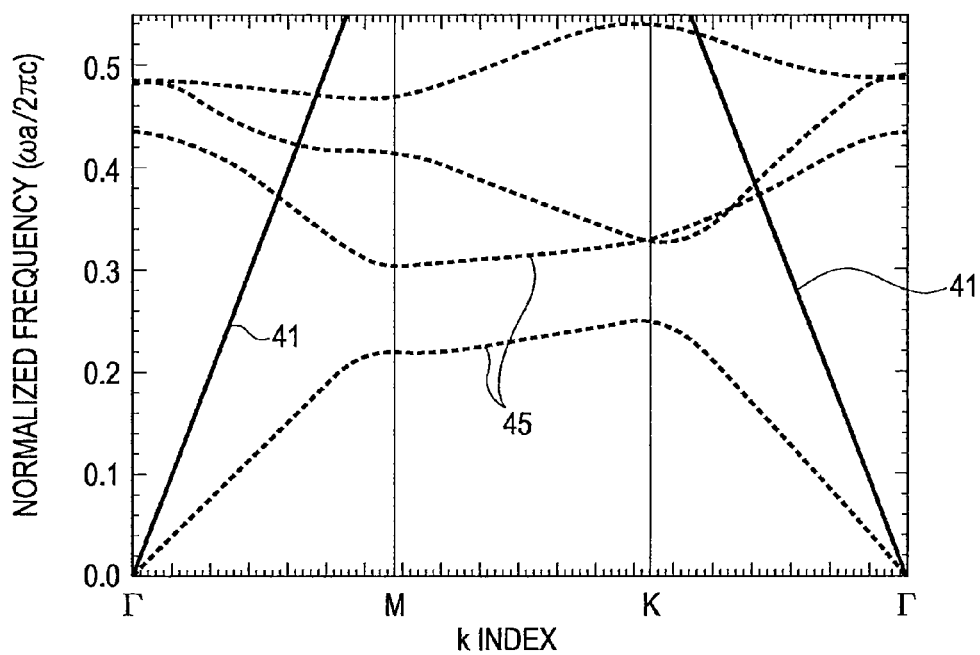
FIG. 4 is a schematic diagram showing a photonic band structure.

FIG. 4 is a schematic diagram showing a photonic band of a two-dimensional photonic crystal. The abscissa indicates a wave number vector and the ordinate indicates a normalized frequency of light ($\omega a/2\pi c$: wherein $\omega$ represents an angular frequency of light, a represents a lattice constant of a photonic crystal, and c represents light velocity in vacuum.).

The above-described resonance in the in-plane direction occurs only for light with a mode of energy higher than the energy of a light cone 41 (a boundary in which guided light in a two-dimensional slab is subjected to total reflection at the slab interface) in the photonic band structure. In other words, in FIG. 4, the resonance in the in-plane direction occurs for light present in the upper area relative to the lines of the light cone 41.

In general, the resonance of light in the in-plane direction is easily performed in the multimode. Therefore, when the area of a mirror is increased (i.e., when the spot size of a laser beam is increased to, for example, 5 μm or more), the phase of the emitted beam is different depending on the position in the in-plane direction.

To overcome this problem, by introducing parts that disorder the periodicity, which are a feature of the present invention, into a photonic crystal, single mode light whose phase is aligned can be realized over a large area (for example, 5 to 50 μm in diameter).

Figure 5:
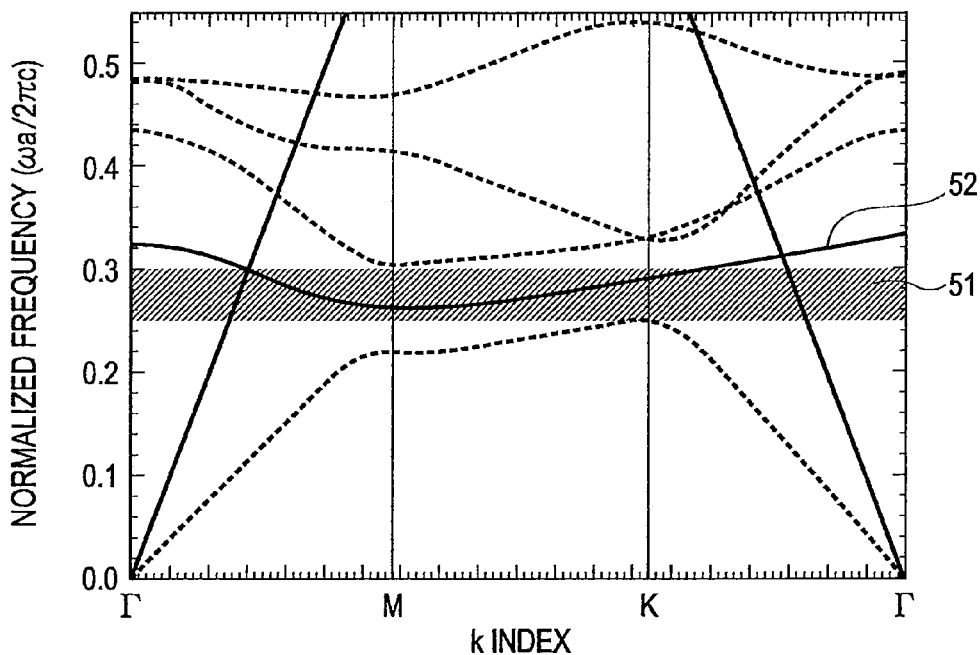
FIG. 5 is a schematic diagram showing a photonic band of a two-dimensional photonic crystal in which defects have been introduced.

In a photonic band diagram as shown in FIG. 4, a frequency band 45 in which a photonic band is not present is referred to as a photonic bandgap in imitation of the electron band theory in solid crystals. FIG. 5 is a photonic band diagram when parts that disorder the periodicity (hereinafter also referred to as "defect parts") are disposed in a two-dimensional photonic crystal. A frequency band (wavelength region) indicated by an area 51 in FIG. 5 indicates a photonic bandgap.

The magnitude of the photonic bandgap is changed depending on the difference in refractive index between a high refractive index part and a low refractive index part of the photonic crystal. When the difference in the refractive index is large, the photonic bandgap is also increased. When the difference in the refractive index is small, the photonic bandgap is also decreased. When the difference in the refractive index is excessively small, the photonic bandgap disappears.

In a two-dimensional photonic crystal slab as shown in FIG. 2, the magnitude of the photonic bandgap is changed depending on the dimension of holes formed in the slab, i.e., a base material, the shape of lattice, the period, and the like.

In two-dimensional photonic crystals, the photonic bandgap in a photonic crystal having a triangular lattice is generally larger than that of a photonic crystal having a square lattice. As an approximate standard, when the difference in refractive index is 1.8 or less, the triangular lattice can be used rather than the square lattice because a large photonic bandgap width can be obtained. Examples of such a substance include GaN and $TiO_2$.

Both the triangular lattice and the square lattice may be used for a substance such as Si or GaAs, in which a refractive index difference of 1.8 or more can be obtained.

Regarding a structure having a photonic crystal, light of a frequency band within the photonic bandgap is not present in the structure. However, when defect parts are introduced into the structure, a new level (i.e., defect level 52 in FIG. 5) appears within the photonic bandgap and light can be present in the defect parts. In other words, even light within the photonic bandgap can be guided in the crystal through the defect parts. The reflection in a two-dimensional photonic crystal having such defect parts is performed by such light having a frequency of a defect mode.

It is believed that, by introducing defect parts such that no levels are present close by, light components present in the defect level (i.e., localized light components in the defect parts) interact strongly and are coupled with each other. As a result, oscillation is easily performed in the single transverse mode. Thus, a plurality of parts that disorder the periodicity is introduced into a periodic-refractive-index structure. Consequently, a VCSEL that emits light whose phase is aligned can be provided even when the spot size is large, for example, the spot size is in the range of 5 to 50 μm.

Embodiments below describe VCSELs that have a spot size of 15 μm and oscillate in the single mode.

The present invention provides a structure that easily oscillates in the single mode. The field of application of the present invention is not limited to a VCSEL having a spot size of 5 to 50 μm. In addition, although the description of a two-dimensional photonic crystal has mainly been made, the present invention can also be applied to a three-dimensional photonic crystal.

The position and the size of the parts that disorder the periodicity of a periodic-refractive-index structure (defect parts) in the present invention are not particularly limited. However, as described above, a new level must be formed within the photonic bandgap by introducing the defect parts.

The interval between a plurality of defect parts introduced in the periodic-refractive-index structure must be determined so that light components can be present on the introduced defect parts and the light components present on each of the defect parts can be coupled with each other. In other words, a plurality of defect parts is arrayed with such an interval that the distributions of light intensity mainly obtained from the introduced defect parts have an area where the distributions overlap with respect to each other.

The interval depends on the material and the structure of the photonic crystal, and the wavelength region of light to be guided. For example, in the case of a photonic crystal prepared by forming holes on a slab so as to form a triangular lattice (period a), a photonic crystal having a refractive index of about 3.5, a slab thickness of 0.5a, and a hole diameter of 0.4a, an interval between the defect parts can be, for example, from two to eight periods. The term "period" means the period of a periodic-refractive-index structure. Here, normalization is performed with a lattice constant, and a condition relating to only the period is described as an example.

Furthermore, the period of the periodic-refractive-index structure and the interval between a plurality of defect parts to be introduced also depend on the design of the oscillation wavelength. For example, in the case of laser beam having a wavelength of 670 nm, the period of the periodic-refractive-index structure is set to 180 nm in the in-plane direction and a part that does not include a hole (defect part) is disposed every three periods. In this case, oscillation in the single transverse mode can be performed even with a spot size of 15 μm. The periodic-refractive-index structure may have a period corresponding to the wavelength of light emitted from an active layer or an integral multiple of the emission wavelength.

The interval between the defect parts can be appropriately determined, for example, in the range from 2 times or more (i.e., two periods or more) to 50 times or less, 20 times or less, or further 10 times or less of the period of the periodic-refractive-index structure. When a film is laminated on the periodic-refractive-index structure, a structure that does not use the dielectric constant of air or vacuum, that is, a structure that does not use the air-gap can also be used.

(Method for Introducing Defect Parts)

Referring to an example of the two-dimensional photonic crystal in FIG. 2, as described above, the holes 1210 are partially removed (that is, further holes are not formed or some of existing holes are filled), or holes having a dimension different from that of other surrounding holes are formed, thereby forming the defects.

Alternatively, another substance having a different refractive index (a solid material other than air) may be introduced into the parts used as the defects, thereby forming the defects.

The degree of disorder of the periodicity of the photonic crystal is controlled by introducing the defect parts. Thereby, the defect level in a photonic band diagram can be disposed at the center of the photonic bandgap. For example, in the example of the two-dimensional photonic crystal in FIG. 2, the control is achieved by tuning the diameter of the holes in the defect parts to an appropriate value. However, when the degree of disorder of the periodicity due to the introduction of the defect parts is excessively small, the defect level is disposed at a position close to a band edge of the photonic bandgap.

When the defect mode is close to the band edge, the difference in energy between the defect mode and a mode of the band edge or the inside of the band becomes small, and thus a plurality of modes including the defect mode may be disposed in the gain region of a laser active layer together. In such a case, the selectivity of modes is degraded, which easily results in phenomena that oscillation is performed in a plurality of modes at the same time and a plurality of modes is unstably switched.

Therefore, from the standpoint of easily controlling the oscillation mode, the defect level can be present at the center of the photonic bandgap. Specifically, the defect level is designed so as to be disposed within the photonic bandgap.

The defect level is designed so as to be present within the central 70%, 50%, or 30% of the photonic bandgap, i.e., a region within an area extending on either side of the center of the photonic bandgap so as to encompass 70%, 50%, or 30% of the area of the photonic bandgap and so as to be spaced from the band edge of the photonic bandgap.

(Types of Defect Parts)

Regarding a plurality of defect parts of a photonic crystal introduced in at least one mirror constituting a resonator of a VCSEL, the defect part itself may have a periodicity (periodic defect) or may not have any periodicity (aperiodic defect).

Herein, the term "periodic defect" means the case where the positions for introducing the defects spatially have transitional symmetry. Such a periodic defect can be often introduced by merely changing the refractive index value without changing the spatial arrangement of the periodic-refractive-index structure in which the defects have yet not introduced. For example, in the two-dimensional photonic crystal in FIG. 2, a photonic crystal in which a defect (a place where a hole is not provided) is provided for every two periods of holes is an example of the periodic defect.

In this case, the period of the defects can be freely changed. As described above, the defect period can be appropriately adjusted so that light components localized in the defect parts are coupled with each other. The period of the defects may have anisotropy relative to a direction of a primitive lattice.

The term "aperiodic defect" means the case where the distribution of the defects does not have spatial transitional symmetry but the defects are disposed so as to have a certain type of regularity. For example, the defects may be distributed on the basis of a certain type of mathematical pattern, or the structure may have a quasi-crystalline structure that does not have symmetry locally but has symmetry over a long period. An embodiment of the case where the distribution of the defects has a mathematical pattern will be described in a third embodiment. In addition to a point defect having a size corresponding to one lattice point, a line defect in which defect parts are continuously connected, or a defect in which three or more point defects continuously form one defect (referred to as large point defect) may also be used. In such a case, at the line defect or the large point defect part, the point defects are connected to each other. Therefore, the interval between the defects corresponds to one period. However, the line defects or the large point defects are arrayed with an interval of about 2 to 8 periods, and thus the localized light components are coupled with each other. In addition, these three types of defect, i.e., the point defect, the line defect, and the large point defect may be combined. Introducing defects also provides the following effect. By introducing defects, the distribution of refractive index on the mirror can be controlled to change the mode pattern of the emitted light. In other words, the mode pattern of the emitted light is changed by changing the type of the defects. Thus, the far-field pattern of the laser beam can be varied. Such an effect can be achieved even when the interval between the defects is not set to a distance in which the localized light components are coupled with each other.

The periodic-refractive-index structure in the present invention may be as follows. That is, the periodic-refractive-index structure in the second reflective mirror includes a first layer and a second layer. Specifically, the first layer has a structure in which the refractive index periodically changes in the in-plane direction, and the second layer includes a part that disorders the periodicity of the periodic-refractive-index structure.

The first layer and the second layer are disposed in the vicinity of an active layer constituting a surface emitting laser. The part that disorders the periodicity of the refractive index of the two-dimensional photonic crystal is formed in the second layer. In the present invention, it is sufficient that the second layer itself functions as a defect. The structure (e.g., holes) in the second layer does not necessarily have a periodicity. The phrase "in the vicinity" of the active layer means a range in which light generated in the active layer has an optical effect.

To produce such a surface emitting laser device, in the present invention, the first layer and the second layer may form the following structure. Specifically, the first layer may have a first two-dimensional periodic structure layer in which columnar structures composed of a second medium having a second refractive index are periodically provided at a certain interval in a first medium having a first refractive index. The second layer may have a two-dimensional periodic structure layer in which columnar structures composed of a fourth medium having a fourth refractive index are provided in a third medium having a third refractive index. These layers are formed so that the interval of the columnar structures in the second layer is different from the periodicity of the columnar structures in the above first two-dimensional periodic structure layer. Furthermore, the shape, dimensions, and the like of the columnar structures in the second layer is different from those of the columnar structures in the first two-dimensional periodic structure layer. The arrangement of the columnar structures in the second layer does not necessarily require a periodicity.

In this case, the second medium having the second refractive index and the fourth medium having the fourth refractive index may be the same medium. Furthermore, the first medium having the first refractive index and the third medium having the third refractive index may be the same medium, and the second medium having the second refractive index and the fourth medium having the fourth refractive index may be the same medium. The first medium having the first refractive index and the third medium having the third refractive index may be a semiconductor layer, and the second medium having the second refractive index and the fourth medium having the fourth refractive index may be air Either the second medium having the second refractive index or the fourth medium having the fourth refractive index may be a porous semiconductor layer.

(Materials of Structure Having a Photonic Crystal)

Any of metals, semiconductors, and dielectric materials may be used for a two-dimensional photonic crystal mirror, but materials, such as semiconductors and dielectric materials that transmit light having a wavelength of laser oscillation can be mainly used. When oscillation is performed by optical-pumping, both semiconductors and dielectric materials may be used. When oscillation is performed by current injection, semiconductors can be used.

Two-dimensional photonic crystals have a structure in which a low refractive index part and a high refractive index part are periodically arrayed. A structure including a high refractive index part composed of a semiconductor having a high refractive index, such as silicon, and a low refractive index part composed of a hole can provide the largest difference in refractive index. In other words, such a structure can achieve a large photonic bandgap.

When current injection is performed through such a two-dimensional photonic crystal mirror, the low refractive index part can be composed of a semiconductor having a refractive index lower than that of the material used in the high refractive index part.

The thickness in the direction perpendicular to the periodic-refractive-index structure of a two-dimensional photonic crystal (the direction in which the periodic-refractive-index structure is not present) will be described. The thickness is determined so that the transverse mode of light guided in a crystal in the two-dimensional in-plane direction is single. Although the thickness varies depending on the wavelength of light to be guided and the material constituting the photonic crystal, it can be derived by a known calculation method (see, for example, "Hikari doharo no kiso" (Fundamentals of optical waveguides) (by Katsunari Okamoto, The Optronics Co., Ltd.), Chapter 2).

For example, the case where a silicon photonic crystal is used and a substance outside the photonic crystal is air will be described. The thickness of the photonic crystal is controlled to 220 nm or less for guided light with a wavelength of 1.5 μm, thereby achieving the single transverse mode.

The medium outside the photonic crystal in the direction perpendicular to the periodic-refractive-index structure of the two-dimensional photonic crystal (the thickness direction, i.e., the emitting direction of the VCSEL) may be composed of air or any other material. However, when the oscillation is performed by current injection, the medium can be composed of a material having a refractive index lower than that of a material having a higher refractive index among materials constituting the photonic crystal so that light is effectively confined in the two-dimensional photonic crystal and a carrier is injected from an electrode on a mirror to an active layer. Furthermore, the refractive index of the medium outside the two-dimensional photonic crystal can be the same as that of the photonic crystal. However, as described above, the structure including air, i.e., another medium, may be asymmetric. In this case, the refractive index of the outside medium can be lower than that of the material with high refractive index constituting the photonic crystal.

In addition, the light-emitting parts in the parts that disorder the periodicity of the periodic-refractive-index structure can be disposed with an interval in which the light-emitting parts are optically coupled with each other, and the vertical cavity surface emitting laser device emits light in a single transverse mode.

In a specific VCSEL structure, the first reflective mirror, the active layer, and the second reflective mirror having the periodic-refractive-index structure are disposed on a substrate in that order and the first reflective mirror is composed of a multilayer film mirror (DBR mirror).

In another VCSEL structure, the second reflective mirror having the periodic-refractive-index structure, the active layer, and the first reflective mirror are disposed on a substrate in that order and the first reflective mirror is composed of a multilayer film mirror. Alternatively, both the first reflective mirror and the second reflective mirror may be composed of a two-dimensional photonic crystal.

When the first reflective mirror, the active layer, the second reflective mirror having the periodic-refractive-index structure, and an electrode are provided on a substrate in that order, the device can have the following structure from the viewpoint of the current injection.

Namely, the periodic-refractive-index structure is not provided in a part of the second reflective mirror disposed directly under the electrode.

The periodic-refractive-index structure may include a first area in which the parts that disorder the periodicity are disposed and a second area in which the parts that disorder the periodicity are not disposed, and the second area may be positioned so as to surround the first area.

In particular, the first area can be composed of a square lattice and the second area can be composed of a triangular lattice.

In the present invention, defects are not necessarily introduced in the periodic-refractive-index structure as long as light emits in the single transverse mode. Accordingly, the present invention includes the following structure. Namely, a vertical cavity surface emitting laser device includes a substrate; a first reflective mirror; an active layer; and a second reflective mirror, the first reflective mirror, the active layer, and the second reflective mirror being provided on the substrate, wherein the first reflective mirror and the second reflective mirror include a two-dimensional periodic-refractive-index structure, and the device emits laser light in a single transverse mode.

The present invention also includes the following structure. Namely, a vertical cavity surface emitting laser device includes a substrate; a first reflective mirror; an active layer; and a second reflective mirror, the first reflective mirror, the active layer, and the second reflective mirror being provided on the substrate, wherein at least one of the first reflective mirror and the second reflective mirror includes a two-dimensional periodic-refractive-index structure, the spot size of the emitted light is 5 µm or more, and the emitted light is the single transverse mode.

The present invention also includes the following structure. A vertical cavity surface emitting laser device includes a substrate; a first reflective mirror; an active layer; and a second reflective mirror, the first reflective mirror, the active layer, and the second reflective mirror being provided on the substrate, wherein at least one of the first reflective mirror and the second reflective mirror includes a two-dimensional periodic-refractive-index structure. In the two-dimensional periodic-refractive-index structure, in a wavelength range of from 5 to 50 nm, the difference between the reflectance at the resonance wavelength and the reflectance at any wavelength within the wavelength range is within 3%, the wavelength range including the resonance wavelength, and the light emitted from the vertical cavity surface emitting laser device is emitted in a single transverse mode.

A photonic crystal having a periodic structure in the in-plane direction is irradiated with light from a direction perpendicular to the in-plane direction. When the reflectance or the transmittance is measured while the wavelength (or the frequency) is varied, a wavelength at which the reflectance is about 100% is present. This wavelength is generally referred to as "resonance wavelength". When light having the resonance wavelength is incident on the photonic crystal, the light is temporarily guided in the in-plane direction and then returns as reflected light.

The reflectance at the resonance wavelength is approximately 100%. However, in general, when the wavelength is shifted from the resonance wavelength by about 1 nm, the reflectance is drastically decreased by 20% or more. When the above reflex action at the resonance wavelength is applied to a mirror of a VCSEL, considering the margin for errors in production, a wavelength range for which the ratio of change in the reflectance relative to the reflectance at the resonance wavelength is within 3% must be in the range from about 5 to 50 nm.

A photonic crystal in which the change in the reflectance is suppressed within about 3% in a wavelength range of 30 nm, the range including the resonance wavelength, is described in a paper by Fan et al. (Optics Express, Vol. 12, No. 8 (2004), pp. 1575-1582). From the viewpoint of the production of VCSELs, such a photonic crystal mirror can be used.

Some characteristic structures of the present invention will now be described.

(The Case where Cavity Mirrors Constituting a VCSEL are Composed of a Multilayer Film Mirror and a Photonic Crystal)

The following case will now be described. Among a pair of mirrors in a resonator of a laser device, one of the mirrors is a multilayer film mirror and the other mirror is composed of a photonic crystal including the above-described defect parts.

Regarding a pair of reflective mirrors constituting a resonator of the surface emitting laser device of the present invention, when one of the mirrors has a periodic-refractive-index structure in which defects have been introduced, any mirror may be used as the other mirror. Of course, both layers formed on and under an active layer may be composed of a photonic crystal.

A structure in which a distributed Bragg reflector (DBR) mirror used in a known VCSEL is used as one of the mirrors will be described. A mirror having the structure that has been described above can be used without further treatment as the mirror having the periodic-refractive-index structure in which defects have been introduced. All the above-described structures relating to the pattern of the periodic-refractive-index structure, the variation of the defects, and the like may be used.

A DBR mirror used in a normal VCSEL or the like can be used as a multilayer film mirror in the present invention. The DBR mirror is generally prepared by alternately laminating two types of material having different refractive indices. The thickness d of one layer in each medium is designed so that an equation represented by $Nd=\lambda/4$ (N: refractive index of medium, $\lambda$: wavelength of resonating light) is satisfied. Examples of the materials used in the DBR mirror include metals, dielectric materials, and semiconductors. Considering optical absorption by metals, dielectric materials and semiconductors can be used. In addition, when driving is performed by current injection, metals having low electrical resistance and semiconductor materials can be used.

Specific examples thereof include materials that have relatively close lattice constants with respect to each other, such as $In_xGa_{1-x}As_yP_{1-y}/In_{x'}Ga_{1-x'}As_{y'}P_{1-y'}$, $Al_xGa_{1-x}As/Al_yGa_{1-y}As$, and $GaN/Al_xGa_{1-x}N$. In order to increase the reflectance of this mirror, it is necessary that the difference in refractive index between the two types of material is as large as possible and the number of laminated layers is large. However, in the case where the mirror is produced using a conductive material, when the number of laminated layers is increased, the electrical resistance in the direction perpendicular to the surface of the laminated film increases. In order to successfully inject current into the device through the mirror, the electrical resistance of the mirror is required to be low. Therefore, in this case, a desired reflectance is required to be obtained under the condition that a large difference in refractive index between the two types of material of the mirror is ensured while the number of laminated layers is kept as small as possible. Furthermore, when a mirror is used as a reflective mirror of a surface emitting laser cavity, the mirror may be produced by only crystal growth without other processes such as cladding. Accordingly, the material of the mirror may have a lattice constant close to that of the material constituting the main part of the laser device.

Both mirrors disposed on and under an active layer may be composed of a photonic crystal. In such a case, one of the mirrors may be composed of a photonic crystal in which no defects have been introduced and the other mirror may be composed of a photonic crystal having defects. When a photonic crystal is used as a mirror, the photonic crystal can be used for an upper mirror disposed opposite to a lower mirror with the active layer therebetween rather than the lower mirror disposed between a substrate and the active layer. The reason for this is that when a periodic-refractive-index structure is formed using holes, a smaller number of films formed on the structure can simplify the production process. Needless to say, one of the mirror layers disposed on and under the active layer may be composed of a photonic crystal and the other mirror layer may be composed of a multilayer film (DBR) including layers whose refractive indices are different from each other.

(The Case where the Mirror is Composed of a Multilayer Film Having a Plurality of Periodic-Refractive-Index Structures)

In the surface emitting laser device of the present invention, the periodic-refractive-index structure constituting a pair of reflective mirrors of a resonator may be composed of a single structure (with one period) or may have a structure in which a plurality of types of such a single structure are combined.

For example, the case where the periodic-refractive-index structure is composed of a two-dimensional photonic crystal will be considered. A two-dimensional photonic crystal mirror constituting the resonator may be composed of a plurality of layers laminated in the resonating direction of light in the resonator (emitting direction, hereinafter described as resonance in the vertical direction) to form at least one of the cavity mirrors. Instead of the two-dimensional photonic crystal, a three-dimensional photonic crystal may also be used. A spacer layer composed of air or another medium may be provided between a periodic-refractive-index structure region having a certain periodicity and another periodic-refractive-index structure region having another periodicity. Thus, the cavity mirror may have a structure of a multilayer film mirror in which a pair of layers including the periodic-refractive-index structure layer and the spacer layer forms one period.

The pair of the layers is required to be designed so that the phases of light resonating in the mirror are matched. Specifically, there are two conditions for the phase matching: First, the positional relationship of the periodic-refractive-index structures in the direction parallel to the resonating direction of light resonating in the two-dimensional photonic crystal (i.e., the direction perpendicular to the emitting direction of light, this direction is referred to as the horizontal direction) is constant. Secondly, the thickness of the pair of layers is adjusted while the first condition is satisfied.

The first condition should be considered when the thickness of the spacer layer provided between periodic-refractive-index structure layers is small and two or more of the periodic-refractive-index structures are optically coupled with each other. In such a case, an alignment (parallel shift or rotation) of the periodic-refractive-index structures in the horizontal direction is required. If these positions are not aligned, the phases of light emitted from the periodic-refractive-index structures in the vertical direction are different from each layer, resulting in a decrease in the reflectance. Even when the thickness of the spacer layer is large and the periodic-refractive-index structures are not optically coupled with each other, the positional relationship can be constant.

Regarding such a positional relationship, for example, when a plurality of two-dimensional photonic crystal slabs having the same period are laminated, the positions of holes are matched with an accuracy within an error of 3 nm.

The second condition can be satisfied by adjusting the thickness of the pair of layers while the first condition is satisfied. As described above, when the thickness of the periodic-refractive-index structure layer is excessively large, the mode in the vertical direction in the layer disadvantageously becomes a multimode. Accordingly, the thickness of the periodic-refractive-index structure layer may be fixed and only the thickness of the spacer layer may be changed to adjust the total thickness. In order to obtain a large difference in refractive index between the spacer layer and the periodic-refractive-index structure and to increase the reflectance, the spacer layer can be composed of air. When current injection is performed through the mirror, the material of the spacer layer can be a metal or a semiconductor. However, considering optical absorption by metals, the spacer layer can be composed of a semiconductor in order to decrease the threshold of the laser.

Use of the above cavity mirror composed of a plurality of periodic-refractive-index structures can increase the reflectance compared with a mirror composed of a single periodic-refractive-index structure.

(Active Layer and Spacer Layer (Cladding Layer))

As an active layer and a spacer layer that constitute a resonator, a double hetero-structure, a multiple quantum well structure, a quantum dot structure, or the like, which is used in normal VCSELs, can be directly applied. When the refractive index of the mirror is higher than that of the cladding layer, the length L of the resonator (the distance between cavity mirrors) represented by the thickness of the active layer+the thickness of cladding layers must be designed so that the relationship of $NL+\Delta L=n\lambda/2$ (N: refractive index of resonator medium, n: positive integer, $\lambda$: wavelength of resonating light, $\Delta L$: change in the optical path length by the phase shift during mirror reflection) is satisfied. Furthermore, the active layer can be disposed at the antinode of standing waves formed in the resonator.

Examples of the materials of the active layer and the cladding layer include materials of those used in known VCSELs, such as GaAs/AlGaAs, InGaAsP/InP, AlGaInP/GaInP, GaN/InGaN/AlGaN, and GaInNAs/AlGaAs. In an example of the structure, n- and p-type GaN layers are used for the cladding layers disposed on either side of the active layer and a non-doped GaN/InGaN multiple quantum well structure is used for the active layer.

(Method of Carrier Injection to Active Layer)

Regarding a method of carrier injection to the active layer 1040, for example, carrier injection to the active layer is performed by current injection from an electrode including a pair of an anode and a cathode.

Examples of the electrode that can be used include a ring electrode, which is used in normal VCSELs, and electrodes having various shapes such as a circle and a rectangle.

When the periodic-refractive-index structure is composed of a solid medium with holes, a pattern of the periodic structure is not formed on an area disposed directly under the electrode. The reason for this is that the contact resistance may increase because of the presence of the holes.

The material of the electrode depends on the laser device material of the area on which the electrode is formed.

For example, Au—Ge—Ni or Au—Sn may be used for the electrode on an n-type GaAs layer and Au—Zn or In—Zn may be used for the electrode on a p-type GaAs layer. A transparent electrode, such as indium tin oxide (ITO), may also be used. In particular, when an electrode other than a ring electrode is formed on a light-emitting surface of the device, a transparent electrode can be used.

(A Structure in which a Medium Having a Refractive Index Lower than that of a Medium Having the Highest Refractive Index Among the Media Constituting a Periodic-Refractive-Index Structure is Introduced at Positions Adjacent to the Periodic-Refractive-Index Structure of a Reflective Mirror with an Interval Smaller than the Period of the Periodic-Refractive-Index Structure)

In the surface emitting laser device of the present invention, a low refractive index medium may be introduced at positions adjacent to a periodic-refractive-index structure of a reflective mirror with an interval smaller than the period of the periodic-refractive-index structure. Thereby, the effective refractive index at the positions can be decreased. The low refractive index medium to be introduced must have a refractive index lower than that of a medium having the highest refractive index among the media constituting the periodic-refractive-index structure of the reflective mirror. For example, in a two-dimensional photonic crystal prepared by periodically forming holes on silicon (Si), a medium having a refractive index lower than that of Si serving as a base material may be introduced with an interval smaller than the period of the holes. A structure in which this medium is composed of air can be achieved by allowing a material adjacent to the photonic crystal to be porous. This structure can prevent light guided in the periodic-refractive-index structure from leaking to the outside. Consequently, the light can be effectively confined in the periodic-refractive-index structure.

Any medium may be introduced as long as the medium has a refractive index lower than that of a medium having the highest refractive index among the media constituting the periodic-refractive-index structure. The structure in which the medium is composed of air, in other words, the structure prepared by forming a porous structure containing holes can be used because such a structure can provide a large difference in refractive index with the medium that has the highest refractive index and that constitutes the periodic-refractive-index structure, and improve the efficiency of light confinement in the periodic-refractive-index structure.

The VCSEL according to the present invention can be used as various light sources for light emission. An array of the VCSELs may also be used as a multi-beam light source. For example, the present invention can be applied to an image forming apparatus disclosed in Japanese Patent Laid-Open No. 2004-230654. Examples of the image forming apparatus include a copy machine, a laser beam printer, and a facsimile machine wherein a laser beam from a laser light source, the laser beam being subjected to light modulation, is guided on an image-carrying surface such as a photoreceptor or an electrostatic recording medium and image information composed of, for example, an electrostatic latent image is formed on the surface. Hitherto, when a VCSEL is used as a light source, the maximum output is low and thus the luminous power is insufficient in a structure in which a laser beam passes through a plurality of optical systems such as a polygon scanning mirror. According to the present invention, since the size of emission spot can be increased to 5 µm or more, the VCSEL of the present invention can be used as a surface emitting laser with high output.

Embodiments of the present invention will now be described.

Embodiments described below are illustrative and conditions such as the structural materials, the dimensions, and the shapes of laser devices used in the present invention are not limited to the following first to sixth embodiments.

First Embodiment

Figure 6:
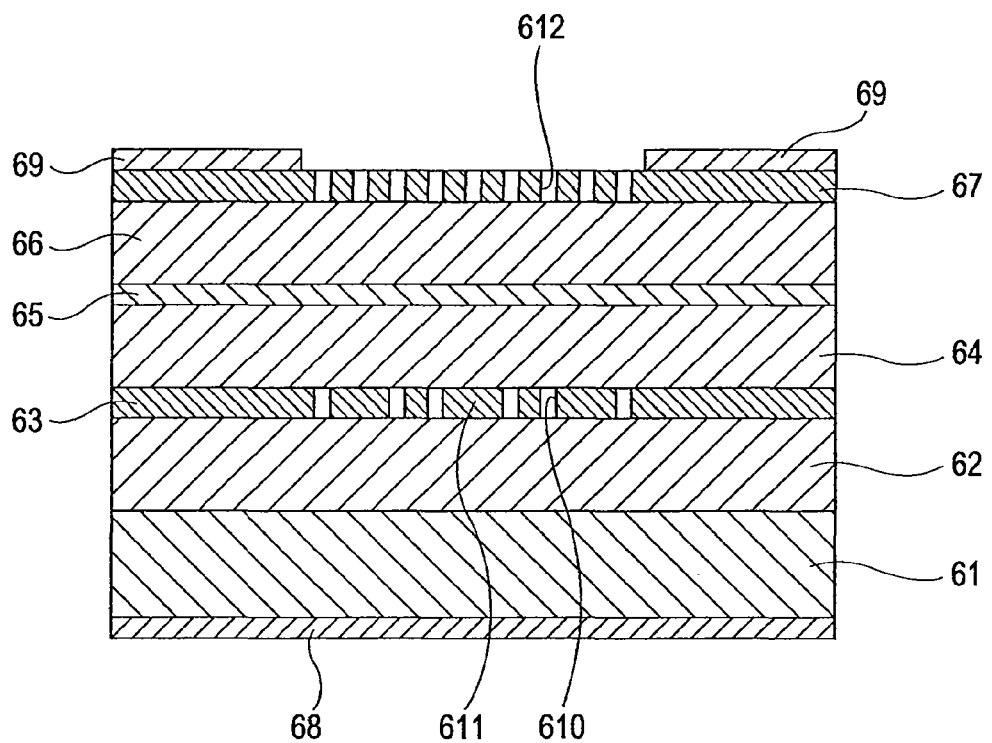
FIG. 6 is a schematic cross-sectional view showing an embodiment of the structure of a laser device.

The structure of a laser device according to a first embodiment will now be described with reference to FIG. 6.

A lower cavity mirror light confinement layer 62, a lower cavity mirror layer 63, a lower cladding layer 64, an active layer 65, an upper cladding layer 66, and an upper cavity mirror layer 67 are sequentially laminated on a substrate 61. An n-electrode 68 and a p-electrode 69 are provided on the reverse face of the substrate 61 and on the top face of the upper cavity mirror layer 67, respectively.

The substrate 61 is an n-type GaAs substrate having a thickness of 565 µm. The lower cavity mirror light confinement layer 62 is composed of n-type $Al_{0.7}Ga_{0.4}As$ and has a thickness of 1 µm. The lower cavity mirror layer 63 is composed of n-type $Al_{0.4}Ga_{0.6}As$ and the lower cladding layer 64 is composed of n-type $(Al_{0.5}Ga_{0.5})_{0.5}In_{0.5}P$. The upper cavity mirror layer 67 is composed of p-type $Al_{0.4}Ga_{0.6}As$ and the upper cladding layer 66 is composed of p-type $(Al_{0.5}Ga_{0.5})_{0.5}In_{0.5}P$.

Photonic crystal structures 610 and 612 forming mirrors are provided at the centers of the lower and upper cavity mirror layers 63 and 67, respectively. Defects 611 are introduced only in the lower mirror.

The distance between the lower and upper cavity mirror layers 63 and 67 (i.e., the length of the resonator) is about 1.5 µm (corresponding to about 7.5 times the wavelength of resonating light of 670 nm). The active layer 65 has a strained quantum well structure composed of non-doped $In_{0.56}Ga_{0.44}P/(Al_{0.5}Ga_{0.5})_{0.5}In_{0.5}P$. The number of layers of the well is three. Each of the $In_{0.56}Ga_{0.44}P$ layer and the $(Al_{0.5}Ga_{0.5})_{0.5}In_{0.5}P$ layer has a thickness of 6 nm. The n-electrode 68 adjacent to the substrate is composed of Ni/Au/Ge and the p-electrode 69 adjacent to the mirror is composed of Au—Zn.

The above laminated film can be produced by the following steps. An $Al_{0.9}Ga_{0.4}As$ lift-off layer is formed on a GaAs substrate by a metalorganic chemical vapor deposition (MOCVD) method. Layers including those from the upper cavity mirror layer to the lower cavity photonic crystal mirror layer are sequentially formed on the lift-off layer by MOCVD. Since the GaAs substrate, which has been used for the first growth, must be lifted off in a later process, the lift-off layer is interposed between the substrate and the upper cavity mirror. The layers including those from the upper cavity mirror layer to the lower cavity mirror layer are then sequentially formed on the lift-off layer. First, the lower cavity mirror is formed. A photonic crystal pattern of the lower cavity mirror is formed by electron beam (EB) lithography and reactive ion beam etching (RIBE) using $Cl_2$ gas. A wafer is prepared by forming the lower cavity mirror light confinement layer with a thickness of 1 μm on a separate GaAs substrate. The surface of the lower cavity mirror layer and the surface of the lower cavity mirror light confinement layer are aligned and joined by thermal fusion bonding. Thus, the formation of the lower cavity mirror is completed. Next, the upper cavity mirror is formed. The $Al_{0.6}Ga_{0.4}As$ lift-off layer adjacent to the upper cavity mirror layer is selectively etched with hydrofluoric acid to remove the GaAs substrate, which has been used for the first growth. A photonic crystal pattern is formed on the exposed upper cavity mirror layer by the same method as that used to form the pattern on the lower cavity mirror layer. Thus, the formation of the upper cavity mirror is completed. Finally, the n-electrode and the p-electrode are formed on the reverse face of the GaAs substrate and on the upper cavity mirror layer, respectively, by vapor deposition.

The photonic crystal mirrors of the lower and upper cavity mirrors will now be described in detail.

Figure 7B:
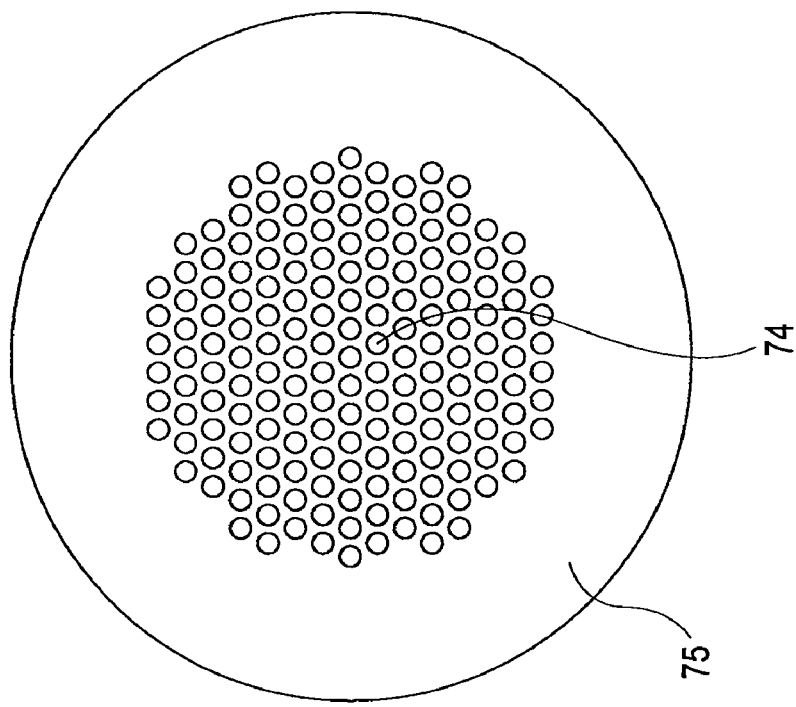
FIGS. 7A and 7B are schematic views of cavity mirrors.
Figure 7A:
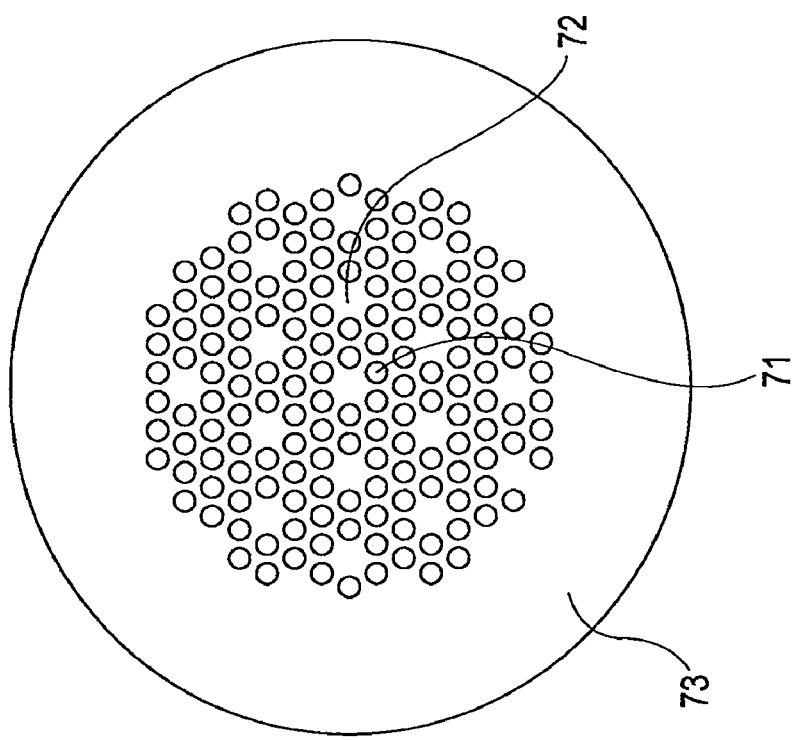

FIGS. 7A and 7B are plan views of the photonic crystals of the lower and upper mirrors, respectively. The photonic crystal structure is formed by periodically providing holes 71 or 74 in the $Al_{0.4}Ga_{0.6}As$ layer. For example, as described above, such fine holes can be formed on the $Al_{0.4}Ga_{0.6}As$ layer by transferring a pattern formed by EB lithography by dry etching.

In both the lower and upper mirror layers, the holes each have a round shape and are arrayed in a triangular lattice with a period of 180 nm. The radius of the holes is 75 nm and the thickness of the layer is 270 nm. Hereinafter, a photonic crystal structure in which no defect has been introduced is defined as a basic (or host) photonic crystal structure.

No defects are introduced to the upper photonic crystal mirror in FIG. 7B. In contrast, as shown in FIG. 7A, defects 72 that disorder the periodic-refractive-index structure of the photonic crystal are periodically introduced to the lower photonic crystal mirror.

The defects 72 are formed by periodically removing the hole of the basic photonic crystal. The defects 72 form a triangular lattice as in the basic photonic crystal structure, but the interval between the defects corresponds to three periods of the basic photonic crystal structure. Although the number of periods of the holes of the photonic crystal in FIGS. 7A and 7B is smaller than that in the actual mirror area for the sake of convenience, the basic photonic crystal and the defect are introduced over 80 periods or more in the actual mirror area.

In this embodiment, the defects of the lower photonic crystal mirror are formed by periodically removing the hole in the basic photonic crystal structure. Alternatively, a hole having a size different from that of the hole in the basic photonic crystal may be used. Alternatively, the defects may be formed by introducing another material having a different refractive index into the defect parts.

Regarding the array of the defects, the interval between the defects in this embodiment corresponds to three periods of the photonic crystal structure. The interval may be larger or smaller than this. However, when the interval is excessively large, light components localized in the defects cannot be coupled with each other. Therefore, an upper limit of the interval is present.

In this embodiment, the defects are provided only on the lower mirror among the two upper and lower photonic crystal mirrors. Alternatively, the defects may be introduced to only the upper mirror or both the upper and lower mirrors.

Figure 8:
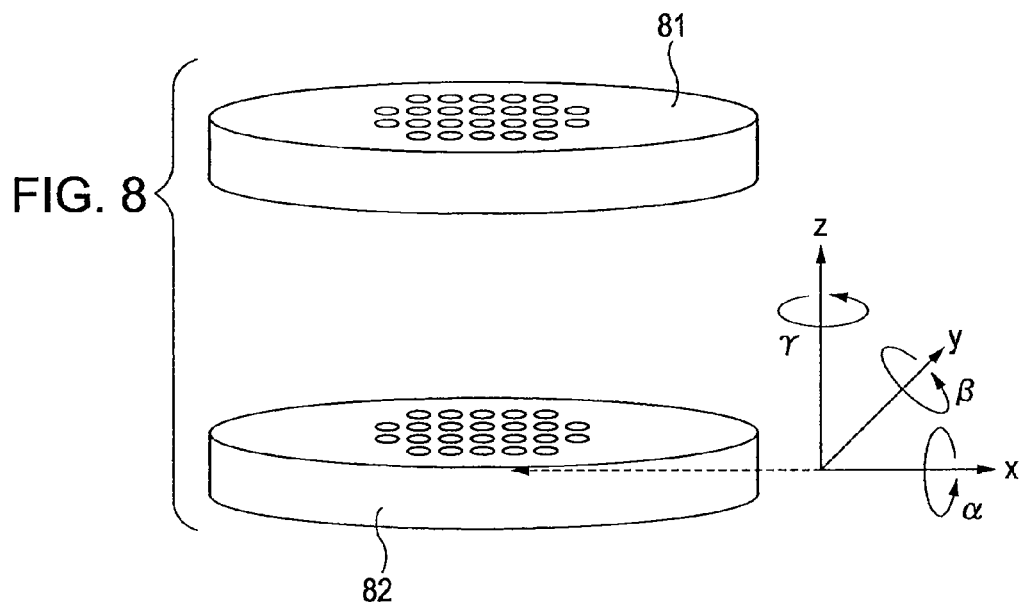
FIG. 8 is a schematic view showing the positional relationship of two cavity mirrors.

Furthermore, the positional relationship between two upper and lower mirrors will be described. FIG. 8 is a view showing the relative positional relationship of an upper cavity mirror 81 and a lower cavity mirror 82 that constitute a resonator.

The figure represents a possible relative positional relationship obtained by moving the lower cavity mirror 82 in the directions of coordinates shown by the arrows, for the sake of convenience. As shown in FIG. 8, the relative positional relationship between the two mirrors is determined in terms of a total of six directions including orthogonal directions of the x, y, and z directions and the α, β, and γ directions, which are directions rotating around the x, y, and z axes, respectively. Each of the directions will now be described in order.

Regarding the x direction and the y direction, conditions required for the positional relationship are significantly different depending on the distance between the two mirrors. Specifically, the conditions depend on the distance between the two mirrors in the z direction. When the two mirrors are separated from each other to only such an extent that light components guided in the in-plane directions of the mirrors can be coupled with each other, the characteristics of the resonator markedly change according to the positional relationship in the x and y directions of the mirrors. Consequently, since the positional relationship in the x and y directions of the mirrors significantly affects the resonance characteristics, the positional relationship in the x and y directions must be kept constant in order to ensure that the characteristics of the laser device are produced constant. Even when the distance between the mirrors is larger than that in the above case, the positional relationship can be maintained constant. The distance is determined by the materials of the resonator, the materials of the mirror, and the wavelength of the resonating light. The resonator of this embodiment has a large distance in the z direction so as to prevent guided light components in the mirrors from coupling with each other. Regarding the γ direction, since the mirrors in the present embodiment do not have a polarization dependence with respect to each other, the polarization property of the emitted light is not particularly affected by the rotation in the γ direction. However, the positional relationship can be maintained constant in this case. The distance in the z direction is adjusted so that the distance L between the two reflective mirrors satisfies the above-described resonating conditions as in a normal VCSEL resonator. The rotations in the α and β directions are required to be reduced as much as possible and are ideally zero so that the two mirrors are completely parallel with respect to each other. However, when the entire laser device in this embodiment can be produced at one time by crystal growth, the rotations in these directions hardly occur, and thus no special adjustment is required.

The lower cavity mirror light confinement layer 62 and the cladding layers 64 and 66 in this embodiment are formed so that the resonating light converted into the guided light of the in-plane direction is effectively confined inside the mirror. Specifically, $Al_{0.7}Ga_{0.4}As$ having a refractive index lower than that of $Al_{0.4}Ga_{0.6}As$, which is the material of the mirrors, is used. For this purpose, for example, the cladding layers may be composed of $Al_{0.4}Ga_{0.6}As$, which is the same material as that of the cavity mirror layers, and the cladding layers may have a structure in which a large number of holes that are sufficiently smaller than the holes constituting the photonic crystal of the mirrors are provided (i.e., porous structure). This structure can decrease the effective refractive index at this area, and thus the resonating light converted into the guided light of the in-plane direction can be easily confined inside the mirror. Furthermore, since this structure can decrease the length of permeation of the light guided in the in-plane direction of the mirrors into the cladding layers, an effect of coupling with the active layer can also be decreased. Consequently, the length of the resonator can be reduced. Referring to FIGS. 7A and 7B, in both lower and upper cavity mirrors, current injection areas 73 and 75 are respectively provided around the light reflection area composed of the above-described two-dimensional photonic crystal slab. In order to reduce the electrical resistance, holes are not provided in the current injection areas 73 and 75. Therefore, only the area including the photonic crystal structure functions as the mirror. The mirror area has a round shape with a diameter of 15 μm.

In this embodiment, a current narrowing structure is formed by increasing the resistance of the semiconductor by proton injection. Specifically, protons are injected into only an area in the vicinity of the active layer, the area being disposed directly under a ring electrode. Thereby, a current is concentrated in the active layer that is disposed directly under the photonic crystal area. Alternatively, a buried hetero-structure formed by crystal regrowth, a current narrowing structure formed by selective oxidation of an AlAs layer, and the like may be used as the current narrowing structure.

When a voltage is applied to the electrodes to inject a current into the active layer, light emitted from the active layer is resonated and amplified in the resonator, resulting in a laser oscillation. The laser beam is red light with an oscillation wavelength of 670 nm. The current is concentrated at the central part of the active layer by the current narrowing structure formed by a process for increasing the resistance by proton injection, thereby increasing the luminous efficiency.

The mechanism of light reflection at the upper and lower cavity mirrors has been described. In particular, the lower mirror in which the defects have been introduced can increase the area of the oscillation spot in the single mode because of the effect of the defects. In the mirrors, 99% or more of the reflectance and the transmittance can be theoretically achieved. However, the mirrors in this embodiment are designed so that the periods of holes are shifted by about several nanometers in order to guide the beam from the direction of the upper cavity mirror. According to this structure, the resonance peak of a mirror is slightly shifted, resulting in a decrease in the reflectance. Consequently, the beam is guided in the upward direction.

According to the active layer and the device in this embodiment, a red laser beam can be obtained using materials composed of AlGaInP/GaInP/AlGaAs. In addition, III-N semiconductors such as GaN/AlN/InN and mixed crystals thereof; and other Group III-V semiconductors such as GaAs/AlAs, InGaAsP/InP, and GaInNAs/AlGaAs and mixed crystals thereof may also be used. Furthermore, Group II-VI semiconductors such as ZnSe/CdSe/ZnS and mixed crystals thereof may also be used. The laser device of this embodiment can provide a single mode red laser beam having a large area of 15 μm in diameter. Furthermore, according to the laser device of this embodiment, a reduction in thermal resistance, a reduction in electrical resistance, and a simplification of production can be achieved as compared with a VCSEL including a resonator with semiconductor DBR mirrors.

Second Embodiment

The structure of a laser device according to a second embodiment will now be described with reference to FIG. 9. A lower cavity mirror light confinement layer 92, a lower cavity mirror layer 93, a lower cladding layer 94, an active layer 95, and an upper cladding layer 96 are sequentially laminated on a substrate 91. A current narrowing layer 99 is provided so as to surround a part of the lower cladding layer 94, the active layer 95, and a part of the upper cladding layer 96. An upper cavity mirror layer 910 is further laminated on the upper cladding layer 96. An n-electrode 911 and a p-electrode 912 are provided on the reverse face of the substrate 91 and on the top face of the upper cavity mirror layer 910, respectively. The substrate 91 is an n-type GaAs substrate having a thickness of 565 μm. The lower cavity mirror layer and the lower cladding layer are composed of n-type $Al_{0.4}Ga_{0.6}As$ and $(Al_{0.5}Ga_{0.5})_{0.5}In_{0.5}P$, respectively. The upper cavity mirror and the upper cladding layer are composed of p-type $Al_{0.4}Ga_{0.6}As$ and $(Al_{0.5}Ga_{0.5})_{0.5}In_{0.5}P$, respectively.

The distance between the lower and upper cavity mirror layers 93 and 910 (i.e., the length of the resonator) is about 1.5 μm (corresponding to about 7.5 times the wavelength of resonating light). Photonic crystal structures (holes) 913 and 915 forming mirrors are provided on the lower and upper cavity mirror layers 93 and 910, respectively. Defects 914 and 916 are disposed at the centers of the lower and upper mirrors, respectively. The upper cavity mirror layer 910 is composed of p-type $Al_{0.4}Ga_{0.6}As$ and has a thickness of 270 nm. The lower cavity mirror layer 93 is composed of n-type $Al_{0.4}Ga_{0.6}As$ and has a thickness of 270 nm. The light confinement layer 92 having a low refractive index is provided between the lower cavity mirror layer 93 and the GaAs substrate 91 having a high refractive index so that light is effectively confined inside the mirror. The light confinement layer 92 is composed of n-type $Al_{0.7}Ga_{0.4}As$ and has a thickness of about 1 μm. In this embodiment, the buried hetero-structured current narrowing layer 99 including an n-type $(Al_{0.5}Ga_{0.5})_{0.5}In_{0.5}P$ sublayer 97 and a p-type $(Al_{0.5}Ga_{0.5})_{0.5}In_{0.5}P$ sublayer 98 is provided. The active layer 95 has a strained quantum well structure composed of non-doped $In_{0.56}Ga_{0.44}P/(Al_{0.5}Ga_{0.5})_{0.5}In_{0.5}P$. The number of layers of the well is three. Each of the $In_{0.56}Ga_{0.44}P$ layer and the $(Al_{0.5}Ga_{0.5})_{0.5}In_{0.5}P$ layer has a thickness of 6 nm. The n-electrode 911 adjacent to the substrate is composed of Ni/Au/Ge and the p-electrode 912 adjacent to the mirror is composed of Au—Zn.

A method for producing this structure is the same method as that of the first embodiment except that a step of forming the current narrowing layer 99 of the buried hetero-structure is added.

Specifically, the step is added in the course of the step of forming an $Al_{0.9}Ga_{0.4}As$ lift-off layer and the layers including those from the upper cavity mirror layer 910 to the lower cavity mirror layer 93 on a GaAs substrate.

The upper cavity mirror layer 910, the upper cladding layer 96, the active layer 95, and the lower cladding layer 94 are grown. Subsequently, an area surrounding the light-emitting part of the active layer 95 is removed by inductively coupled plasma (ICP) dry etching using $Cl_2$ gas. The surrounding area is removed from the lower cladding layer 94 to the middle of the upper cladding layer 96. The n-type $(Al_{0.5}Ga_{0.5})_{0.5}In_{0.5}P$ sublayer 97 and the p-type $(Al_{0.5}Ga_{0.5})_{0.5}In_{0.5}P$ sublayer 98 are then regrown in that order. A planarizing process is then performed, the lower cladding layer 94 is continuously grown, and the lower cavity mirror layer 93 is grown on the lower cladding layer 94.

The subsequent steps are the same as those in the first embodiment.

The structures of the cavity mirrors will now be described in detail.

Figure 9:
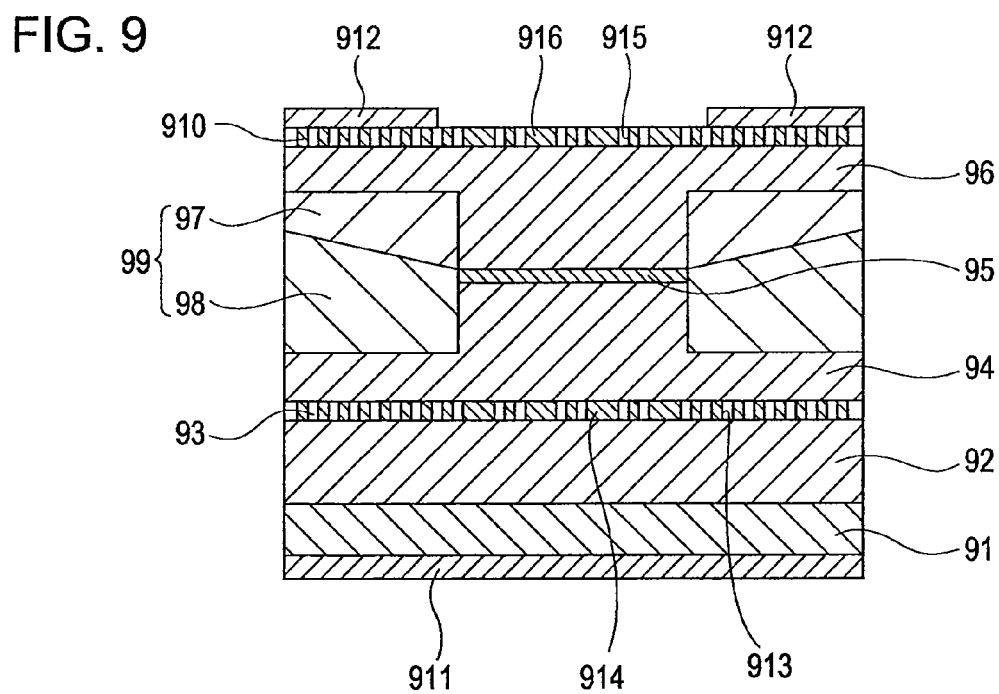
FIG. 9 is a schematic cross-sectional view showing an embodiment of the structure of a laser device.
Figure 10B:
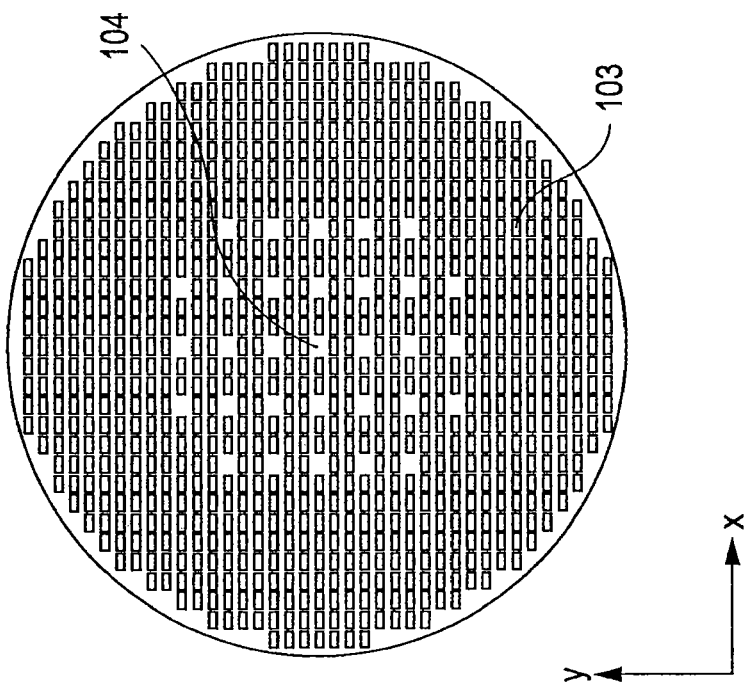
FIGS. 10A and 10B are schematic views of cavity mirrors in a laser device.
Figure 10A:
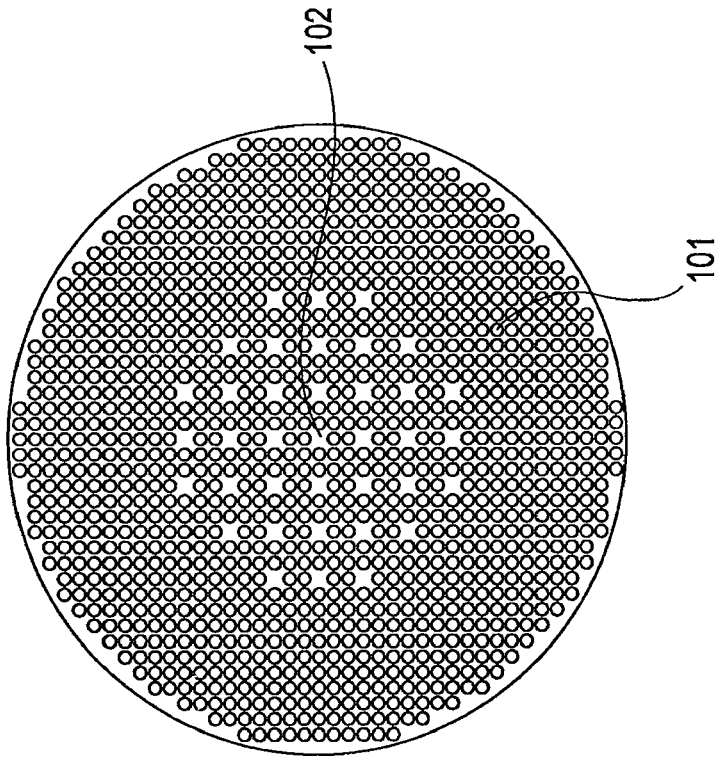

As shown in FIG. 9, the lower and upper cavity mirrors include holes 913 and 915 that constitute a basic photonic crystal and defects 914 and 916 where holes are not formed, respectively. FIGS. 10A and 10B are plan views of the photonic crystals of the lower and upper mirrors in this embodiment, respectively.

FIG. 10A shows the lower cavity mirror and FIG. 10B shows the upper cavity mirror.

Features that are common to both upper and lower mirrors will be described. In this embodiment, holes 101 and 103 of a square lattice photonic crystal structure are provided on the entire area of the mirror layer surfaces. Defects 102 and 104 that do not include a hole are periodically positioned at the central circular area with a diameter of 15 μm. A defect level is formed within the photonic bandgap only at this area. Consequently, light incident on the mirror is reflected by the in-plane guided resonance phenomenon due to the defect level, resulting in an oscillation. It is at the central area of the mirror that the defects are disposed. In contrast, since such a level is not present within the photonic bandgap at the surrounding area composed of only the basic photonic crystal, resonance in the direction perpendicular to the plane does not occur, and thus light is not reflected. In addition, the surrounding photonic crystal structure has a photonic bandgap for light guided in the in-plane direction and causes reflection. Therefore, leakage of light in the photonic crystal mirror area in the in-plane direction can be prevented.

Different points will be described. In the photonic crystal structure of the lower mirror in FIG. 10A, the hole has a round shape, the period is 180 nm, the radius of the hole is 75 nm, and the thickness of the layer is 270 nm. The lower mirror layer includes holes 101 and defects 102. In the photonic crystal structure of the upper mirror in FIG. 10B, the hole has a rectangular shape, the period is 180 nm, the long side of each hole is 70 nm, the short side of each hole is 35 nm, and the thickness of the layer is 270 nm. The upper mirror layer includes holes 103 and defects 104. When both mirrors disposed on and under the active layer are composed of photonic crystals including minute holes, a cladding method can be employed.

In this embodiment, since the holes of the upper mirror have a rectangular shape, the symmetry of the photonic crystal structure is disordered. Consequently, the upper mirror exhibits different reflection characteristics by polarization. Specifically, only polarized light whose electric field vector is orientated in the y direction is reflected on the mirror and oscillation occurs, whereas about 100% of polarized light whose electric field vector is orientated in the x direction is transmitted. Thereby, the polarization of laser can be controlled to achieve an oscillation of single linearly polarized light. Regarding the positional relationship between the upper and lower mirrors, the same relationship as that in the first embodiment is satisfied and the basic conditions for the relationship are the same as those in the first embodiment.

In response to a current injection from the electrodes, oscillation occurs in the direction perpendicular to the photonic crystal mirrors as in the first embodiment. The oscillation occurs in the area having a diameter of 15 μm where the photonic crystal mirrors are provided. A laser beam in the single transverse mode and the single linear polarization is obtained in this area. The laser beam is red light with an oscillation wavelength of 670 nm. The laser beam is emitted only in the upward direction by decreasing the reflectance of the upper mirror to some degree by the same method as that in the first embodiment.

In the laser device according to this embodiment, the spot size and the spot shape in the single mode of the laser beam can be controlled by adjusting the area where the defects of the photonic crystal mirrors are disposed.

Furthermore, the photonic crystal structure surrounding the defect-introduced area of the photonic crystal mirror can suppress the light leakage in the in-plane direction in the mirror, resulting in an improvement in the luminous efficiency of the laser.

In the defect parts of the mirror of this embodiment, holes are not provided. Alternatively, the defects may be formed by introducing holes each having a size larger than or smaller than that of the holes of the basic photonic crystal structure. Alternatively, the defects may be formed by introducing another material having a different refractive index into the defect parts.

In addition to AlGaInP/GaInP/AlGaAs, III-N semiconductors such as GaN/AlN/InN and mixed crystals thereof may also be used for the materials of the device. Furthermore, other Group III-V semiconductors such as GaAs/AlAs, InGaAsP/InP, and GaInNAs/AlGaAs; mixed crystals thereof; Group II-VI semiconductors such as ZnSe/CdSe/ZnS; and mixed crystals thereof may also be used.

Regarding the arrangement of the mirror with round holes and the mirror with rectangular holes, the mirrors may be disposed at positions opposite to those in this embodiment. Alternatively, both the upper and lower mirrors may be the mirrors with rectangular holes. However, only when both the upper and lower mirrors have rectangular holes, the positions must be aligned in the rotation direction shown by the γ axis in FIG. 8 showing the positional relationship of the mirrors. Specifically, the rotation axes of both mirrors are adjusted so that the directions of the vertical axis and the horizontal axis of the rectangle are aligned and the directions of polarization are matched with each other.

Third Embodiment

A third embodiment will now be described with reference to FIGS. 11A and 11B. Since the structure and the materials of the laser device itself are the same as those in the second embodiment, only the structure of the cavity mirrors will be described. The production process is also the same as that of the second embodiment.

Figure 11B:
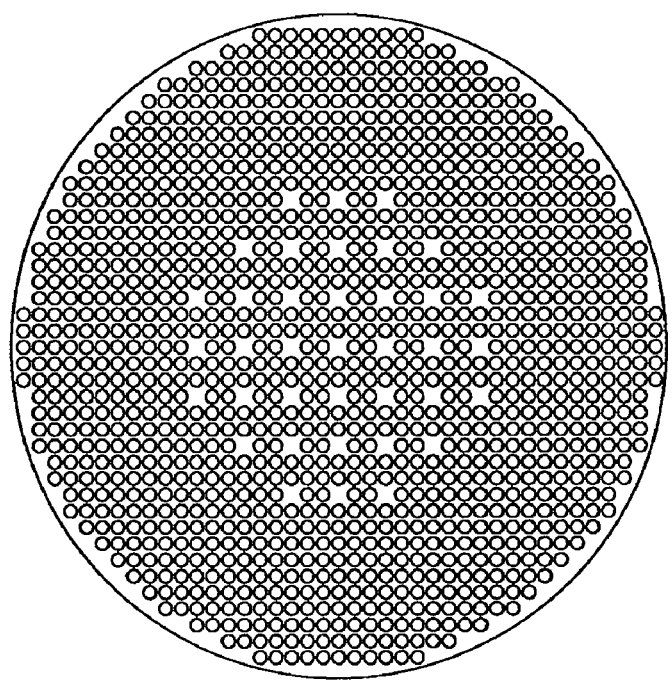
FIGS. 11A and 11B are schematic views of cavity mirrors in a laser device.
Figure 11A:
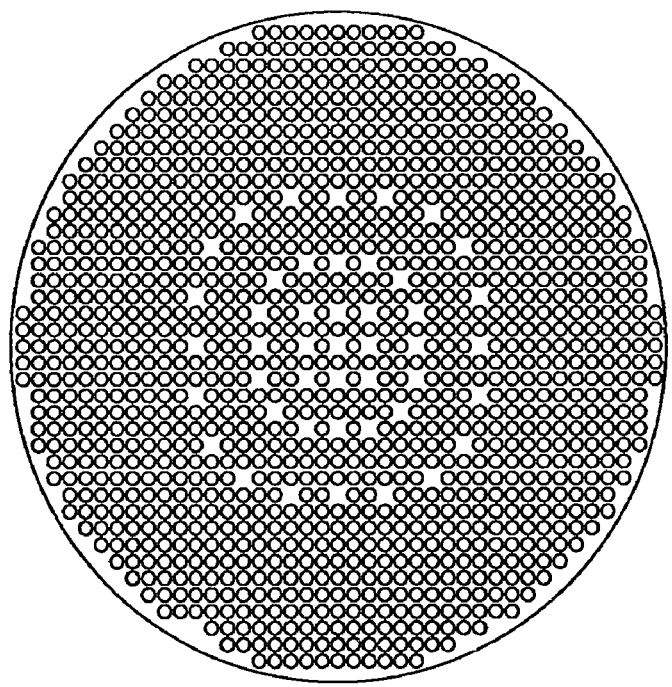

FIGS. 11A and 11B are schematic views of lower and upper photonic crystal mirrors of the third embodiment, respectively, viewed from a direction perpendicular to a planer surface. As shown in FIG. 11A, in the lower cavity mirror, holes of a basic photonic crystal structure are provided in the entire surface, and defects formed by removing the holes are arrayed at the center. Parameters of the basic photonic crystal structure are the same as those of the lower cavity mirror of the second embodiment. This embodiment is characterized in the array of the defects. These defects are arrayed according to a specific regularity but arrayed aperiodically. Roughly, the defects are concentrated around the central part of the mirror and concentrically arrayed at the peripheral part. Furthermore, as the positions of defects become more distant from the central part, the interval between the concentric circles increases. As the positions of defects become more distant from the central part, the defect density at the positions is decreased. Accordingly, the defect density is represented by the following equation:

$$D=D_0\exp(-r^2/a) \quad \text{(Equation 1)}$$

wherein D represents the defect density, r represents a distance from the center, $D_0$ represents the defect density at the center of a mirror, and a represents a predetermined constant that determines the magnitude of a density gradient of the defect from the center. The area of the defect-introduced area is the same as that in the second embodiment, 15 μm in diameter. For the sake of convenience of drawing, the number of periods of the concentric defects is very small in FIG. 11A, even though defects are actually arrayed with 10 periods or more. In this two-dimensional photonic crystal mirror, the optical density is high at the central part, which has a high defect density. On the other hand, as the defect density decreases towards the peripheral part, the optical density also decreases. Consequently, since the defect density in this embodiment has a profile represented by the Gaussian function as equation 1, the mode profile of the laser beam to be emitted is also represented by the Gaussian function. The upper cavity mirror in FIG. 11B is not described because this mirror has the same structure as that of the lower cavity mirror in the second embodiment.

The surface emitting laser device of this embodiment can provide a laser beam having a large area of 15 μm in diameter, a single transverse mode, and a single-peaked mode profile.

In the defect parts of the mirror of this embodiment, holes are not provided. Alternatively, the defects may be formed by introducing holes each having a diameter larger than or smaller than that of the holes of the basic photonic crystal structure. Alternatively, the defects may be formed by introducing another material having a different refractive index into the defect parts.

Regarding the array of the defects in the photonic crystal structure, in addition to the above-described array of the defect density represented by equation 1, for example, as represented by the following equation 2, the defects may be disposed so that the defect density is arranged in a concentric ellipse pattern.

$$D=D_0\exp(x^2/a^2+y^2/b^2) \quad \text{(Equation 2)}$$

wherein a represents the length of the major axis of an ellipse, b represents the length of the minor axis of the ellipse, and x and y represent orthogonal coordinates in a plane.

In addition to AlGaInP/GaInP/AlGaAs, III-N semiconductors such as GaN/AlN/InN and mixed crystals thereof may also be used for the materials.

Furthermore, other Group III-V semiconductors such as GaAs/AlAs, GaAs/InP, and GaInNAs/AlGaAs; mixed crystals thereof; Group II-VI semiconductors such as ZnSe/CdSe/ZnS; and mixed crystals thereof may also be used.

Furthermore, the upper mirror and the lower mirror of this embodiment may be replaced with each other. Alternatively, the defect densities of both the upper and lower mirrors may have various distributions.

As described above, the defect parts provided in the photonic crystal can be arrayed on the basis of the above-described mathematical patterns.

Fourth Embodiment

Figure 12:
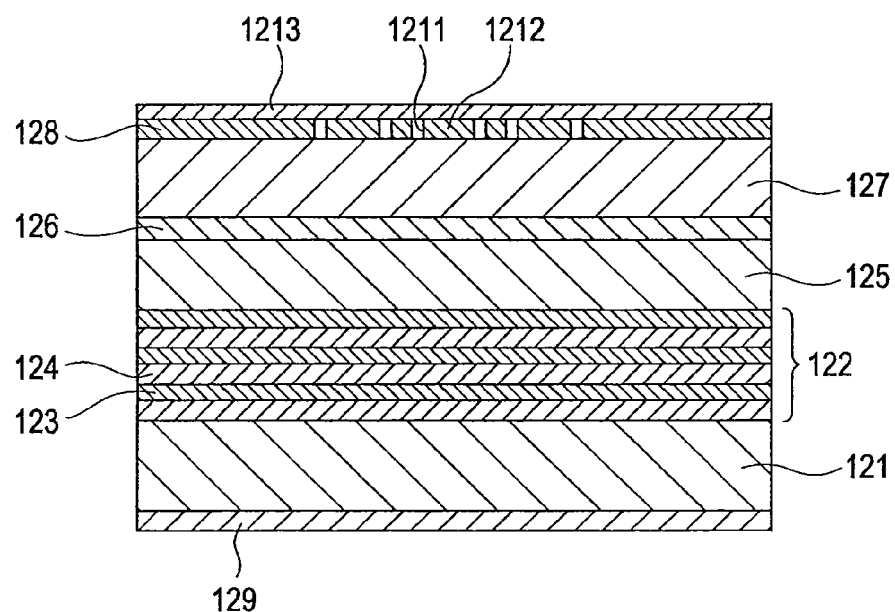
FIG. 12 is a schematic cross-sectional view showing an embodiment of the structure of a laser device.

The structure of a laser device according to a fourth embodiment will now be described with reference to FIG. 12.

A lower cavity mirror layer 122, a lower cladding layer 125, an active layer 126, an upper cladding layer 127, and an upper cavity mirror layer 128 are sequentially laminated on a substrate 121. An n-electrode 129 and a p-electrode 1213 are provided on the reverse face of the substrate 121 and on the top face of the upper cavity mirror layer 128, respectively.

The substrate 121 is an n-type GaAs substrate having a thickness of 300 μm. The lower cavity mirror layer 122 has a structure in which first layers 123 and second layers 124 are alternately laminated. Specifically, a first n-type $Al_xGa_{1-x}As$ layer (first layer 123) includes a lower sublayer with a thickness of 29 nm wherein x=0.55 and an upper sublayer with a thickness of 20 nm wherein x is varied from 0.55 to 0.93. A second $Al_xGa_{1-x}As$ layer (second layer 124) includes a lower sublayer with a thickness of 33.2 nm wherein x=0.93 and an upper sublayer with a thickness of 20 nm wherein x is varied from 0.93 to 0.55. Thus, the lower cavity mirror layer 122 is composed of a DBR mirror in which the first layers 123 and the second layers 124 are alternately laminated. Although all the layers are not shown in the figure, the number of the layers is 70 pairs. As described above, the thickness d of each of the first layers 123 and the second layers 124 is represented by $Nd=(1/4)\lambda$ (N: refractive index of substance, $\lambda$: wavelength of resonating light). The upper cavity mirror layer 128 is composed of p-type $Al_{0.4}Ga_{0.6}As$. A photonic crystal structure 1211 forming a mirror is provided at the center of the upper cavity mirror layer 128 and defects 1212 are introduced in the photonic crystal structure 1211. The upper and lower cladding layers 127 and 125 are composed of n-type $(Al_{0.5}Ga_{0.5})_{0.5}In_{0.5}P$ and p-type $(Al_{0.5}Ga_{0.5})_{0.5}In_{0.5}P$, respectively. The active layer 126 has a strained quantum well structure composed of non-doped $Ga_{0.56}In_{0.44}P/(Al_{0.5}Ga_{0.5})_{0.5}In_{0.5}P$, The number of layers of the well is three. Each of the $Ga_{0.56}In_{0.44}P$ layer and the $(Al_{0.5}Ga_{0.5})_{0.51}In_{0.49}P$ layer has a thickness of 6 nm. The distance between the mirrors including the upper and lower cladding layers 127 and 125 and the active layer 126 (i.e., the length of the resonator) is about 1.5 μm (corresponding to about 7.5 times the wavelength of resonating light). The n-electrode 129 adjacent to the substrate is composed of Ni/Au/Ge and the p-electrode 1213 adjacent to the mirror is composed of Au—Zn.

The above laminated structure is produced as follows. The layers are sequentially formed on a GaAs substrate in the order from the lower cavity DBR mirror to the upper cavity photonic crystal mirror layer by MOCVD. In this embodiment, since the substrate is used without lift-off, the lower cavity mirror is formed first, and other layers are then laminated in order. Subsequently, a photonic crystal pattern of the upper cavity mirror layer 128 is formed by EB lithography and RIBE using $Cl_2$ gas. Finally, the electrodes are formed on the reverse face of the GaAs substrate 121 and on the upper cavity mirror layer 128 by vapor deposition.

In addition to the materials, the structure of this embodiment is also different from that of the device in the first embodiment in that only the upper cavity mirror is changed from the two-dimensional photonic crystal to the DBR mirror, which is a one-dimensional photonic crystal. Therefore, in this embodiment, in order to achieve a large spot size with the single mode, it is necessary that defects are provided in the photonic crystal structure of the upper mirror. Regarding the structural parameters of the mirror, the period is 180 nm, the hole diameter is 75 nm, and the layer thickness is 250 nm. The emitting spot area has a diameter of 15 μm, which is the same as that in the first embodiment. The defects are formed by removing the holes of the basic photonic crystal. Alternatively, as described in the first embodiment, holes each having a diameter different from that of the holes of the basic photonic crystal may be used. Alternatively, the defects may be formed by introducing another material having a different refractive index into the defect parts. Regarding the array of the defects, as described in the first embodiment, the interval between the defects may be larger or smaller than an interval corresponding to three periods of the photonic crystal structure. However, when the interval is excessively large, light components localized in the defects cannot be coupled with each other. Therefore, an upper limit of the interval is present. The porous structure of the cladding layer or the like may also be provided as described in the first embodiment to the third embodiment. The lower cavity mirror is a known DBR mirror used in a normal VCSEL. The characteristics of the DBR mirror such as the materials of the layers, the thicknesses, and the number of periods may be the same as those described above.

The relationship between the upper and lower mirrors in this embodiment will be described. Since the lower cavity mirror does not have a polarization dependence and has a uniform structure in the x, y, and γ directions, precise alignment is not required in the x and y linear directions and in the γ rotation direction in FIG. 8. Unlike the devices in the first embodiment to the third embodiment, the necessity of the alignment can be reduced in this embodiment, resulting in an advantage in the production. Regarding the positional relationship in the other directions, the same conditions as those described in the other embodiments are applied to this embodiment.

In this embodiment, a current narrowing structure is formed by increasing the resistance of the device by proton injection. Specifically, protons are injected into an area disposed directly under the p-electrode, the area being disposed at the periphery of the photonic crystal structure. Thereby, a current is concentrated in the active layer. Alternatively, a buried hetero-structure formed by crystal regrowth, a current narrowing structure formed by selective oxidation of an AlAs layer in the DBR mirror, and the like may also be used as the current narrowing structure.

When a voltage is applied to the electrodes to inject a current into the active layer, light emitted from the active layer is resonated and amplified in the resonator, resulting in a laser oscillation. The laser beam is red light with an oscillation wavelength of 670 nm. By introducing defects in the upper cavity mirror, the oscillation spot in the single mode can be expanded. In this embodiment, the number of laminations of the upper cavity mirror is adjusted so that the reflectance of the upper cavity mirror is lower than that of the lower cavity mirror.

The known DBR mirror is used as the lower cavity mirror of the surface emitting laser device in this embodiment, but the effects such as an increase in the spot size can be achieved as in the first embodiment. From the viewpoints of the reduction in the thickness, the reduction in the electrical resistance, and the improvement in the heat dissipation effect of the device, the laser device in this embodiment is inferior to that in the first embodiment, but is much superior to the known VCSEL in which the DBR mirrors are used as both upper and lower cavity mirrors.

According to this embodiment, by using the known DBR mirror, the device can be easily produced at one time by sequentially growing crystals on a substrate without cladding or the like. Thus, compared with the first embodiment to the third embodiment, this embodiment is significantly advantageous in the production of the device.

Fifth Embodiment

Figure 13:
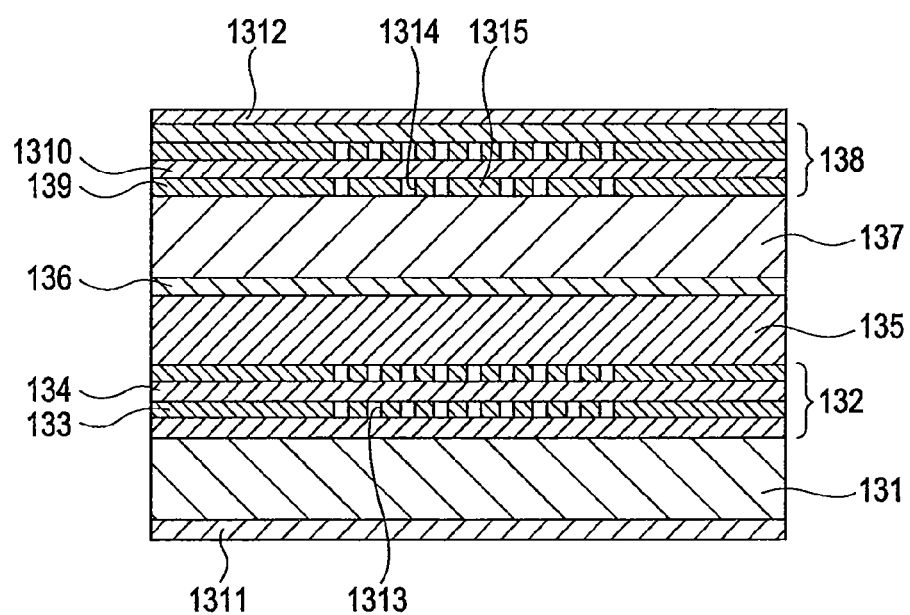
FIG. 13 is a schematic cross-sectional view showing an embodiment of the structure of a laser device.

The structure of a laser device according to a fifth embodiment will now be described with reference to FIG. 13. A lower cavity mirror layer 132, a lower cladding layer 135, an active layer 136, an upper cladding layer 137, and an upper cavity mirror layer 138 are sequentially laminated on a substrate 131. An n-electrode 1311 and a p-electrode 1312 are provided on the reverse face of the substrate 131 and on the top face of the upper cavity mirror layer 138, respectively. The substrate 131 is an n-type GaAs substrate having a thickness of 300 μm. The lower cavity mirror layer 132 is formed by alternately laminating n-type $Al_{0.4}Ga_{0.6}As$ photonic crystal layers 133 and n-type $Al_{0.4}Ga_{0.6}As$ spacer layers 134. The upper cavity mirror layer 138 is formed by alternately laminating p-type $Al_{0.4}Ga_{0.6}As$ photonic crystal layers 139 and p-type $Al_{0.4}Ga_{0.6}As$ spacer layers 1310. Each of the upper and lower mirrors is composed of four layers including two pairs. Holes 1313 and 1314 are periodically provided for every other layer to form photonic crystal mirrors. The spacer layers are provided in order to adjust the phases between the photonic crystal mirrors. The upper and the lower cladding layers are composed of n-type $(Al_{0.5}Ga_{0.5})_{0.5}In_{0.5}P$ and p-type $(Al_{0.5}Ga_{0.5})_{0.5}In_{0.5}P$, respectively. The active layer 136 has a strained quantum well structure composed of non-doped $Ga_{0.56}In_{0.44}P/(Al_{0.5}Ga_{0.5})_{0.5}In_{0.5}P$. The number of layers of the well is three. Each of the $Ga_{0.56}In_{0.44}P$ layer and the $(Al_{0.5}Ga_{0.5})_{0.5}In_{0.5}P$ layer has a thickness of 6 nm. The distance between the mirrors including the active layer 136 (i.e., the length of the resonator) is about 1.5 μm (corresponding to about 7.5 times the wavelength of resonating light). The n-electrode 1311 adjacent to the substrate is composed of Ni/Au/Ge and the p-electrode 1312 adjacent to the mirror is composed of Au.

The above laminated structure is produced as follows. An AlAs lift-off layer is formed on a GaAs substrate and a layer adjacent to the resonator of the upper cavity mirror layer 138 is formed on the lift-off layer by MOCVD. The upper cladding layer 137, the active layer 136, the lower cladding layer 135, and a layer adjacent to the resonator of the lower cavity mirror layer 132 are sequentially formed thereon. The resulting wafer is referred to as wafer A. Since the GaAs substrate is lifted off from wafer A in a later process, the layers are formed in the order opposite to that in the actual device. In this step, among the cavity mirror layers, only the single layer that is in contact with each cladding layer is formed.

Subsequently, the lower cavity mirror layer 132 is prepared. A photonic crystal pattern is formed on the lower cavity mirror layer of wafer A by the same method as that in the fourth embodiment. An AlAs lift-off layer is formed on another GaAs substrate and an $Al_{0.4}Ga_{0.6}As$ spacer layer 134 is formed on the lift-off layer. The resulting substrate is joined on the lower cavity mirror layer of wafer A by thermal fusion bonding. The GaAs substrate is then lifted off by selectively etching the AlAs lift-off layer with hydrofluoric acid, thereby forming the spacer layer 134 of the lower cavity mirror layer. Subsequently, an $Al_{0.4}Ga_{0.6}As$ layer is formed on wafer A again, and a photonic crystal is patterned thereon. Furthermore, another spacer layer 134 is joined on the photonic crystal layer again. A GaAs substrate having only an Al$_{0.4}$Ga$_{0.6}$As layer is used in this step. In bonding of this spacer layer, since the GaAs substrate need not be lifted off, an AlAs lift-off layer need not be provided on the wafer to be bonded. Thus, the formation of the lower cavity mirror is completed.

A method for preparing the upper cavity mirror layer 138 will be described. The GaAs substrate that is used from the start in the preparation of wafer A (which is not the substrate bonded in the subsequent step) is lifted off by selectively etching the AlAs lift-off layer. A photonic crystal is then patterned on the surface layer adjacent to the resonator of the upper cavity mirror by the same method as that described above to form a photonic crystal layer adjacent to the resonator of the upper cavity mirror. Subsequently, two pairs of layers constituting the upper cavity mirror are formed by the same method as that of the lower cavity mirror. However, unlike the lower cavity mirror, the GaAs substrate remaining until the last step is also lifted off in this upper cavity mirror. Thus, the formation of the upper cavity mirror is completed.

A laser cavity is prepared by the above process. Finally, electrodes are formed on the reverse face of the GaAs substrate and on the upper cavity mirror by vapor deposition.

The cavity mirrors of this embodiment will now be described in detail.

The lower and upper cavity mirrors include Al$_{0.4}$Ga$_{0.6}$As photonic crystal layers and Al$_{0.4}$Ga$_{0.6}$As spacer layers. Regarding the structural parameters of the photonic crystal mirrors, the period is 180 nm, the hole diameter is 75 nm, and the layer thickness is 250 nm. Defects 1315 are introduced in one of the photonic crystal mirrors constituting the upper cavity mirror layer 138 by periodically removing the holes. The emitting spot area including the photonic crystal structure has a diameter of 15 μm. Each pair composed of the photonic crystal layer and the spacer layer is designed so that the phase of the reflected light proceeds by (n/2) wavelengths per pair. The pair is designed so that the phase of light reflected on the photonic crystal layer 139 and the phase of light reflected on the photonic crystal provided on the photonic crystal layer 139 are matched in the interface between the photonic crystal layer 139 and the upper cladding layer 137. Specifically, the phase of light reflected by the in-plane guided resonance is constant when the light is emitted from the photonic crystal. Therefore, the thickness of the spacer layer is adjusted such that the phase matching condition is satisfied by two pairs. The spacer layer in this embodiment has a thickness of 48 nm.

The positional relationship between the photonic crystal mirrors in FIG. 8 will be described. The relationship between the upper cavity mirror layer 138 and the lower cavity mirror layer 132 is the same as that in the first embodiment, the third embodiment, and the fourth embodiment. On the other hand, in each cavity mirror layer, the distance between the photonic crystal mirrors in this embodiment is short, i.e., a half-wavelength of the wavelength of the emitted laser light. Therefore, light components guided in adjacent photonic crystal mirrors in the cavity mirror layer in the in-plane direction are coupled with each other. Accordingly, the positional relationship between the mirrors must be adjusted so as to be the same in the x, y, and γ directions in FIG. 8.

In addition to the defects described in this embodiment, holes each having a diameter different from that of the basic photonic crystal may also be used as the defects. Alternatively, the defects may be formed by introducing another material having a different refractive index into the defect parts. Regarding the array of the defects, the interval between the defects may be larger or smaller than an interval corresponding to three periods of the photonic crystal structure.

In this embodiment, the defects are introduced in only one of the photonic crystal mirrors constituting either the upper cavity mirror layer or the lower cavity mirror layer. Alternatively, the defects may be introduced in both the upper cavity mirror layer and the lower cavity mirror layer. In addition, the defects may be introduced in two photonic crystal mirrors constituting each of the upper cavity mirror layer and the lower cavity mirror layer.

A current narrowing structure in this embodiment is also formed by increasing the resistance of the device by proton injection. Specifically, protons are injected into an area disposed directly under the p-electrode, the area being disposed at the periphery of the photonic crystal structure. Thereby, a current is concentrated in the active layer. Alternatively, a buried hetero-structure formed by crystal regrowth, a current narrowing structure formed by selective oxidation of an AlAs layer in the DBR mirror, and the like may also be used as the current narrowing structure.

The behavior in the response of a current injection is the same as that in the fourth embodiment.

Use of the surface emitting laser device in this embodiment can increase the reflectance of the cavity mirrors, compared with a device including a single photonic crystal mirror. Consequently, the threshold current can be decreased. Furthermore, even when the reflectance of each mirror does not satisfy the desired value because of errors in the production or the like, higher reflectance can be achieved by laminating a plurality of the mirrors.

Sixth Embodiment

Figure 15:
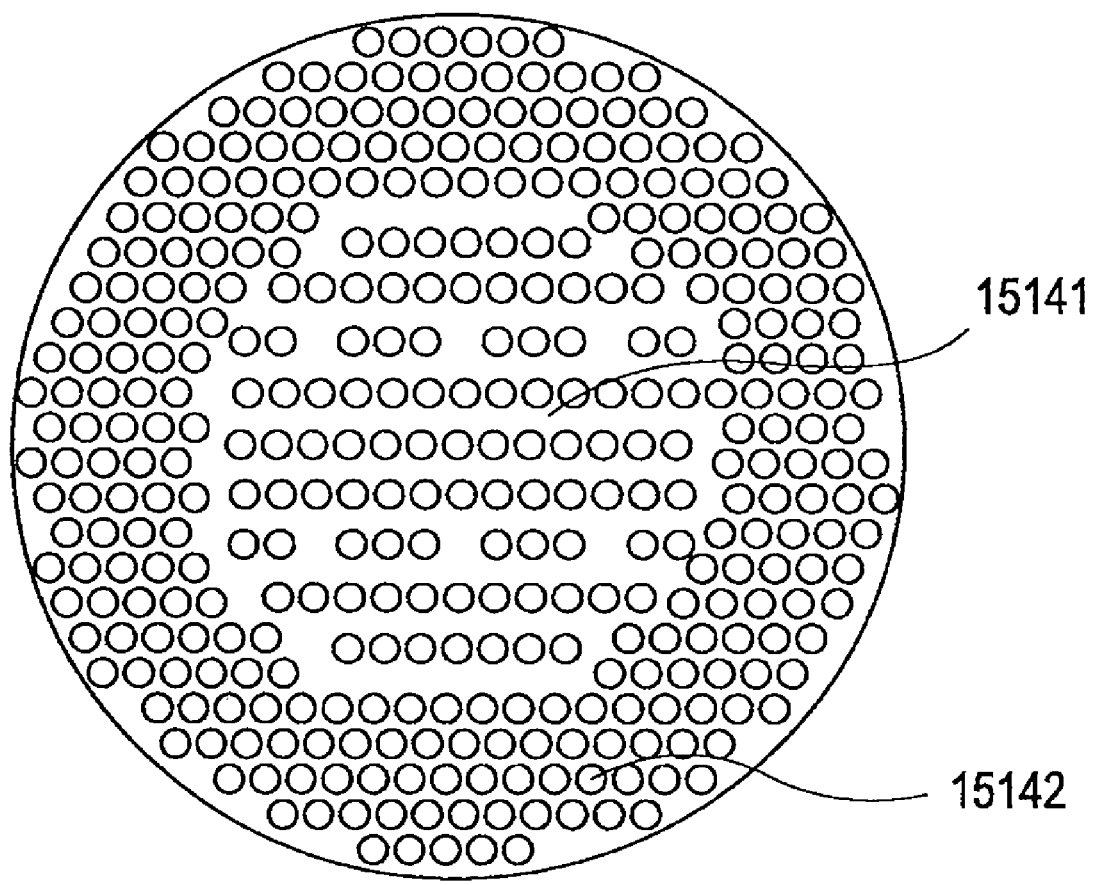
FIG. 15 is a schematic view of a cavity mirror in a laser device.
Figure 16A:
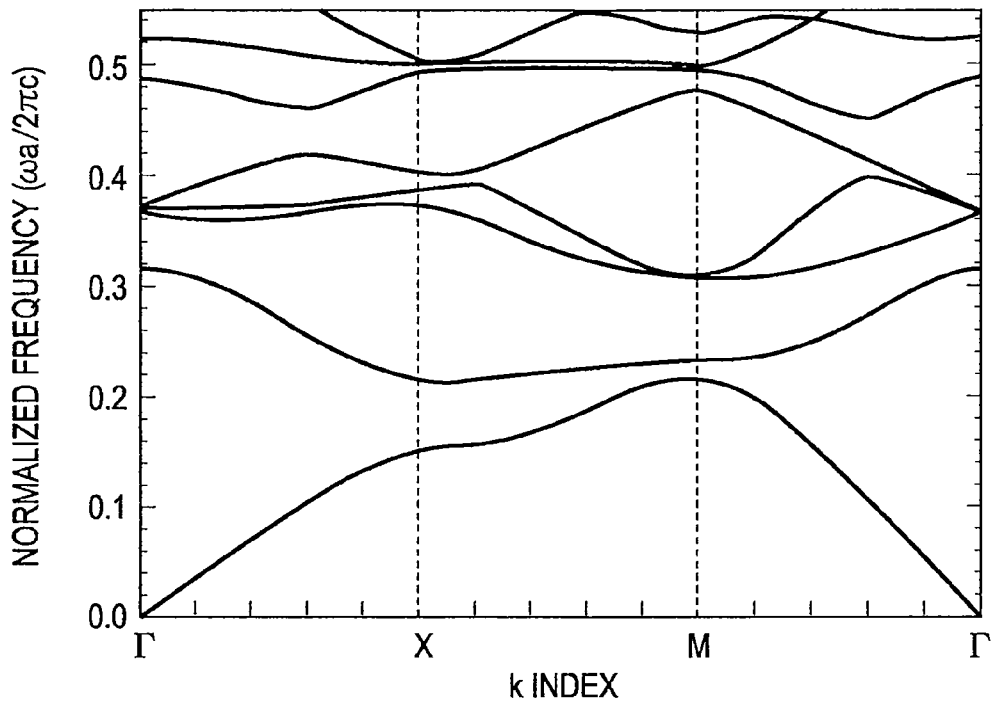
FIGS. 16A and 16B are schematic views each showing a photonic band structure.
Figure 16B:
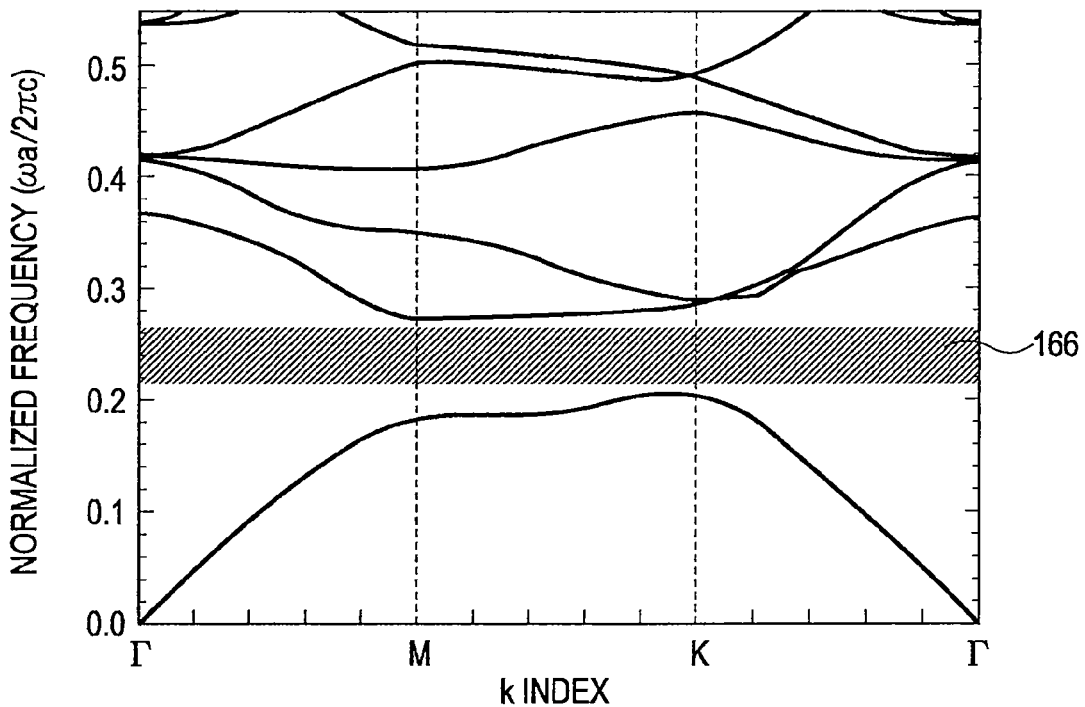

The structure of a laser device according to a sixth embodiment will now be described with reference to FIG. 15. FIG. 15 shows an upper mirror in the laser device according to this embodiment. A photonic crystal structure 15141 composed of a square lattice is provided in a circular area having a diameter of 15 μm at the center of a mirror layer. The periphery of the photonic crystal structure 15141 is surrounded by a photonic crystal structure 15142 composed of a triangular lattice. Defects are periodically introduced in the photonic crystal structure 15141. The structure of the laser device is the same as that in the second embodiment except for this upper mirror. In this embodiment, the structure is prepared such that the defect level of the photonic crystal structure 15141 corresponds within the photonic bandgap of the photonic crystal structure 15142. As a result, the leakage of light in the mirror area in the in-plane direction can be suppressed by the same principle as that described in the second embodiment. This embodiment is different from the second embodiment in that the basic photonic crystal structures are different between the central area functioning as a mirror and the peripheral area suppressing the light leakage. In this case, a feature of the square lattice that the design is relatively simple and a feature of the triangular lattice that the photonic bandgap is generally larger than that of the square lattice (i.e., the light leakage is suppressed more effectively) can be combined. FIGS. 16A and 16B show examples of a photonic band structure of a two-dimensional photonic crystal. The calculation was performed on the basis of a structure in which holes (refractive index: 1.0) each having a radius of 0.3a are periodically arrayed in a solid medium (refractive index: 3.46). The abscissa indicates a wave number vector and the ordinate indicates a normalized frequency of light. FIG. 16A shows a photonic band structure of a square lattice and FIG. 16B shows a photonic band structure of a triangular lattice. The comparison between FIG. 16A and FIG. 16B shows that a photonic bandgap 166 is present in the triangular lattice, whereas such photonic bandgap is not present in the square lattice. In other words, in order to suppress the light leakage in the in-plane direction more effectively, the triangular lattice can be generally used rather than the square lattice. In this embodiment, the structure combining the triangular lattice and the square lattice is used only in the upper mirror. Alternatively, this structure may be used only in the lower mirror or both upper and lower mirrors.

Figure 14A:
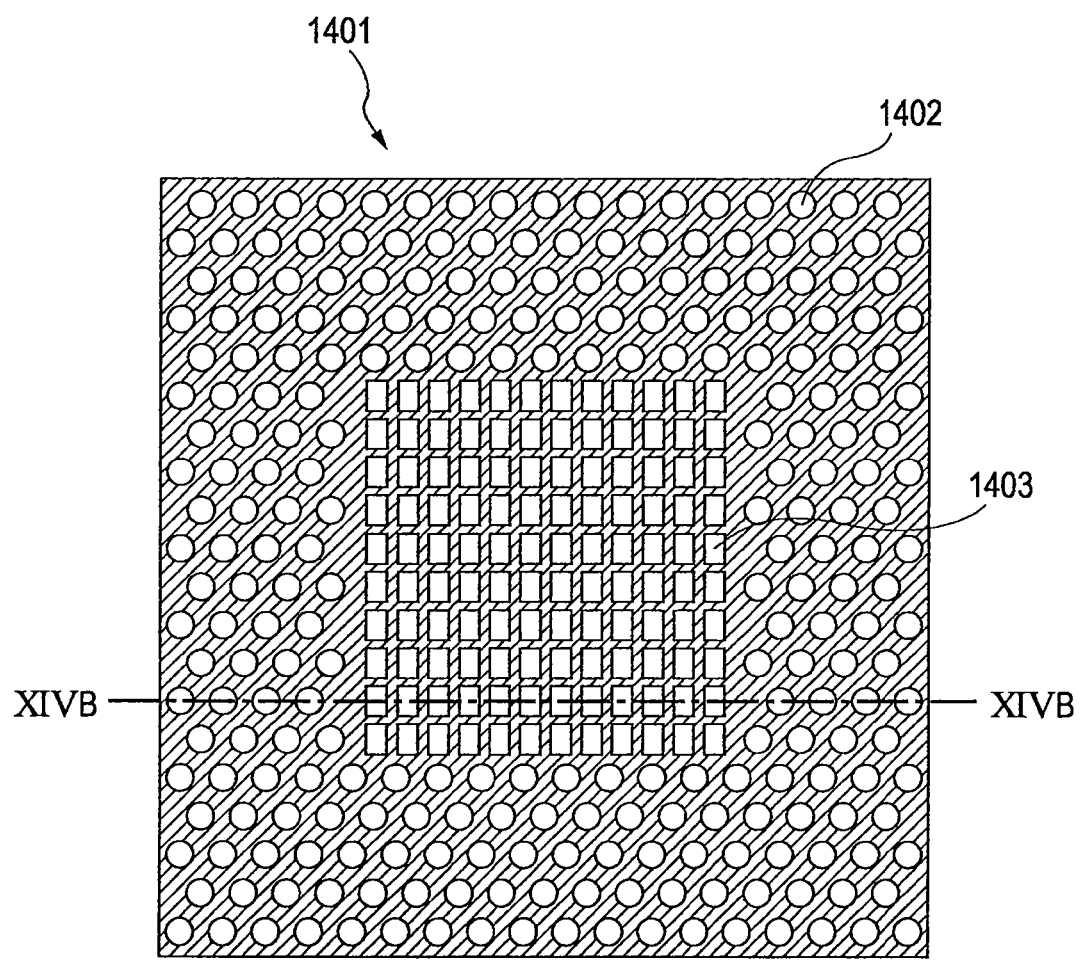
FIGS. 14A and 14B are schematic views of a periodic structure.
Figure 14B:
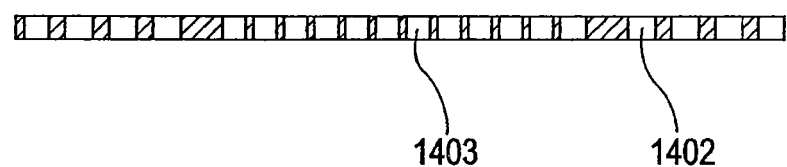

Referring to FIG. 14A, in a two-dimensional photonic crystal slab 1401, a square lattice photonic crystal composed of rectangular square holes 1403 is provided at the central part and a photonic crystal composed of cylindrical holes 1402, which block light by the photonic bandgap effect, is provided around the square lattice photonic crystal. FIG. 14B is a cross-sectional view taken along line XIV B-XIV B in FIG. 14A. According to this structure, light that can be present at the central part is blocked by the surrounding photonic crystal, thereby decreasing an optical loss in the two-dimensional direction. The cylindrical holes 1402 are arrayed in a triangular lattice form and the square holes 1403 are arrayed in a square lattice form.

Seventh Embodiment

Figure 17:
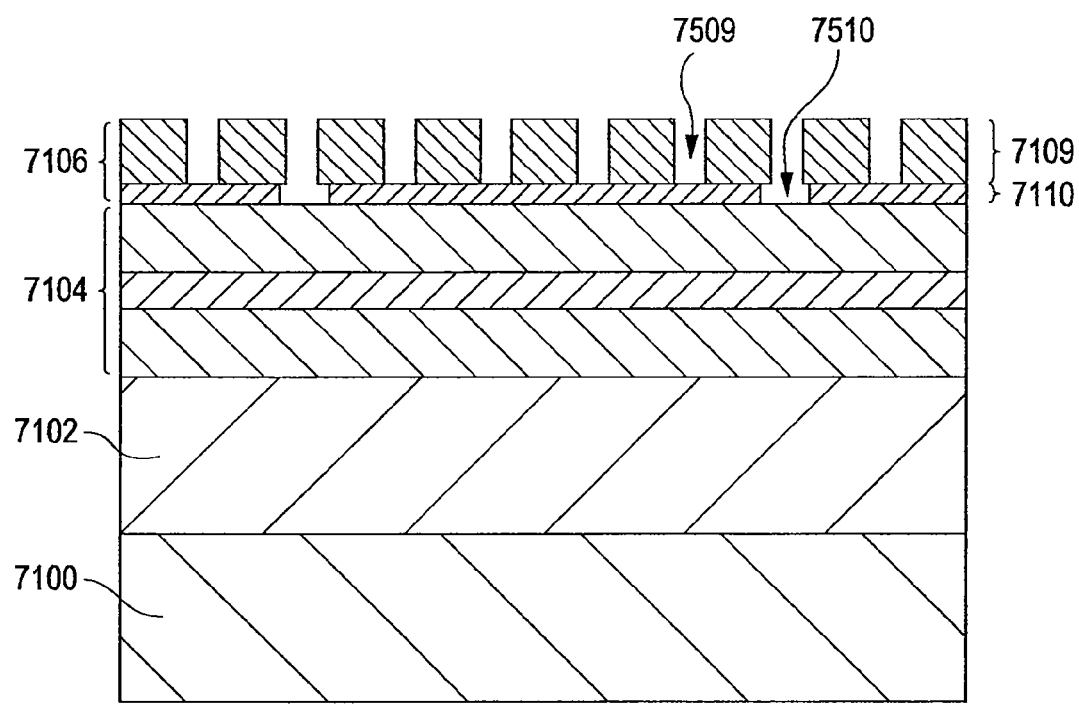
FIG. 17 is a schematic cross-sectional view showing an embodiment of the structure of a two-dimensional photonic crystal surface emitting laser.

A periodic-refractive-index structure 7106 including two layers according to the present invention will now be described with reference to FIG. 17. The feature of this embodiment is that a part that disorders the periodicity of the periodic-refractive-index structure is formed by a second layer 7110 adjacent to a first layer 7109 having a periodic structure. FIG. 17 shows the structure of a two-dimensional photonic crystal surface emitting laser of this embodiment. In FIG. 17, the surface emitting laser includes a substrate 7100, a first mirror 7102, a quantum well active layer 7104, and a second mirror (two-dimensional photonic crystal) 7106.

The surface emitting laser of this embodiment is formed so that the antinode of standing waves formed in the resonator is disposed at boundaries between the active layer and the upper mirror (second mirror) and between the active layer and the lower mirror (first mirror), and at the center of the resonator. The quantum well active layer 7104 is provided at the center of the resonator and is formed so as to perform gain matching. In this embodiment, the first mirror 7102 is a multilayer film reflective mirror produced by alternately laminating a high-refractive-index medium having a thickness of ¼ wavelength and a low-refractive-index medium having a thickness of ¼ wavelength. The above-described two-dimensional photonic crystal mirror to which the present invention is applied is used as the second mirror. In the two-dimensional photonic crystal mirror of this embodiment, the first layer 7109 composed of a first two-dimensional periodic structure and the second layer 7110 composed of a second two-dimensional periodic structure are disposed so as to be in contact with each other.

In the first layer 7109 composed of the first two-dimensional periodic structure, columnar structures 7509 composed of a second medium having a second refractive index are periodically provided at a certain interval in a first medium having a first refractive index. In the second layer 7110 composed of the second two-dimensional periodic structure, columnar structures 7510 composed of a fourth medium having a fourth refractive index are provided in a third medium having a third refractive index at an interval different from the periodicity of the columnar structures 7509 composed of the second medium. As a result, the use of such first and second layers can disorder the periodicity of the first layer. From the standpoint of disordering the periodicity, the pore sizes of the columnar structures (composed of, for example, holes) provided in the first layer and the second layer are preferably determined so as to be different from each other. The second layer 7110 does not necessarily require a periodicity as long as the second layer 7110 has a function of disordering the periodicity of the first layer 7109.

A method of producing the two-dimensional photonic crystal mirror in this embodiment will be described. FIGS. 18A to 18H include schematic views showing steps of producing the two-dimensional photonic crystal mirror of this embodiment. In FIGS. 18A to 18H, reference numeral 8200 indicates a sapphire substrate and reference numeral 8202 indicates a first nitride semiconductor layer. In the figures, reference numeral 8204 indicates a first resist pattern, reference numeral 8510 indicates first columnar holes, reference numeral 8208 indicates a second semiconductor layer, reference numeral 8210 indicates a third nitride semiconductor layer (p-GaN layer), reference numeral 8212 indicates a second resist pattern, and reference numeral 8509 indicates second columnar holes.

Figure 18A:
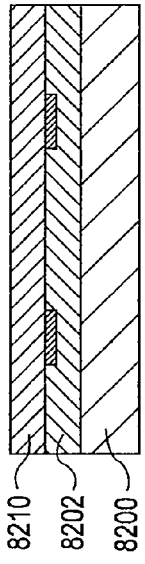
FIGS. 18A to 18H are schematic cross-sectional views showing steps of producing a two-dimensional photonic crystal mirror.

The two-dimensional photonic crystal mirror is produced as follows. First, on the sapphire substrate 8200, a GaN/AlGaN-DBR mirror layer, an n-AlGaN cladding layer, a InGaN/AlGaN-MQW active layer, a p-AlGaN cladding layer, and a p-GaN layer are grown in that order using a metalorganic chemical vapor deposition (MOCVD) system, with a buffer layer provided between the sapphire substrate 8200 and the GaN/AlGaN-DBR mirror layer. Thus, the first nitride semiconductor layer 8202 is formed (FIG. 18A).

Figure 18B:
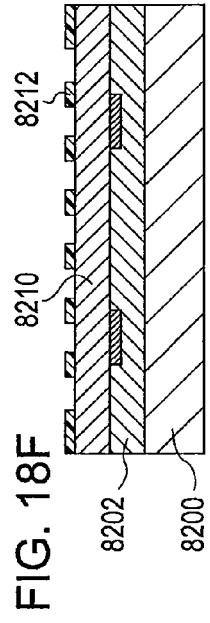

Subsequently, the first resist pattern 8204 is formed on the p-GaN layer by photolithography or electron beam lithography (FIG. 18B).

Figure 18C:
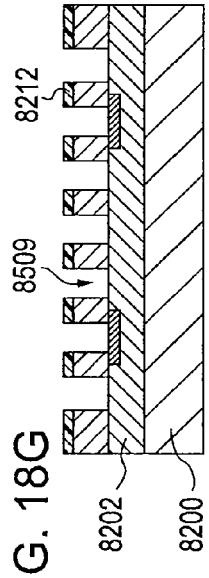

Subsequently, the p-GaN layer of the first nitride semiconductor layer 8202 is dry-etched with a reactive ion beam etching system to form the first columnar holes 8510 (FIG. 18C). The first columnar holes 8510 are formed so as to have a periodicity different from that of the second columnar holes 8509 in the third nitride semiconductor layer 8210 formed in the subsequent step.

Figure 18D:
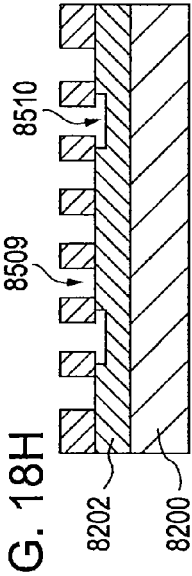

Next, silicon nitride or silicon oxide is embedded in the first columnar holes 8510 formed in FIG. 18C to form the second semiconductor layer 8208 (FIG. 18D). In this step, silicon nitride or silicon oxide is deposited with a sputtering system or a chemical vapor deposition (CVD) system. The second semiconductor layer 8208 composed of silicon nitride or silicon oxide is then formed only in the first columnar holes 8510. Specifically, silicon nitride is deposited on the entire surfaces of the first columnar holes 8510 and the first resist pattern 8204, and the resist is removed to lift off the silicon nitride disposed on the resist. Alternatively, a mask may be separately prepared, and silicon nitride may be deposited only in the first columnar holes 8510.

Figure 18E:
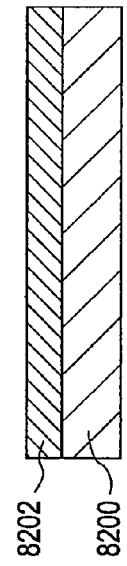

Next, the p-GaN layer, which is the third nitride semiconductor layer 8210, is grown with an MOCVD system or an molecular beam epitaxy (MBE) system on the p-GaN layer, which is the first nitride semiconductor layer 8202 in which silicon nitride or silicon oxide is embedded in the first columnar holes 8510 (FIG. 18E).

Figure 18F:
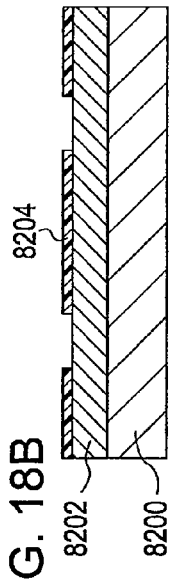

Subsequently, a resist pattern is formed on the p-GaN layer by electron beam lithography (FIG. 18F). As shown in FIG. 18F, the second resist pattern 8212 formed in this step is not disposed on the silicon nitride or silicon oxide parts formed in the step shown in FIG. 18D.

Figure 18G:
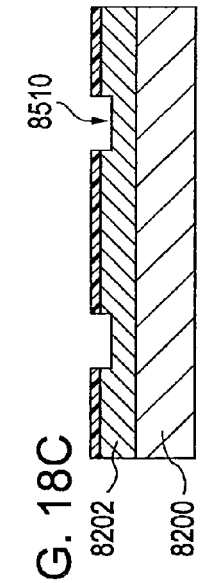

Subsequently, the p-GaN layer is dry-etched with a reactive ion beam etching system to form the second columnar holes 8509 (FIG. 18G). Unlike the above-described first columnar holes 8510, the second columnar holes 8509 are periodically formed at a certain interval. Regarding the etching depth in this step, the etching is performed until the silicon nitride or silicon oxide parts formed in the step shown in FIG. 18D are exposed.

Figure 18H:
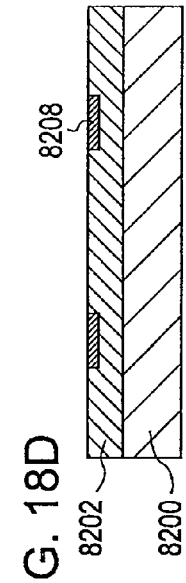

The exposed silicon nitride or silicon oxide parts are selectively removed by etching (FIG. 18H).

Thus, a photonic crystal structure including a second layer 8110 having the first columnar holes 8510 and a first layer 8109 having the second columnar holes 8509 is produced. The second layer 8110 has a structure that disorders the periodicity of the first layer 8109.

In this embodiment, silicon nitride is deposited in the hole parts, but the present invention is not limited thereto. Alternatively, silicon oxide, magnesium oxide, aluminum oxide, or the like may also be used. In this embodiment, silicon nitride formed in the hole parts is removed, however, silicon nitride does not necessarily have to be removed. That is, the columnar holes in FIG. 18D may be filled with a certain medium. This embodiment describes a two-dimensional photonic crystal surface emitting laser including a nitride semiconductor, but the present invention is not limited to such a nitride semiconductor. The present invention can also be applied to, for example, a gallium-arsenic or indium-phosphorus semiconductor. The present invention can be applied to a surface emitting laser with a wavelength ranging from the ultraviolet to infrared region.

Figure 19:
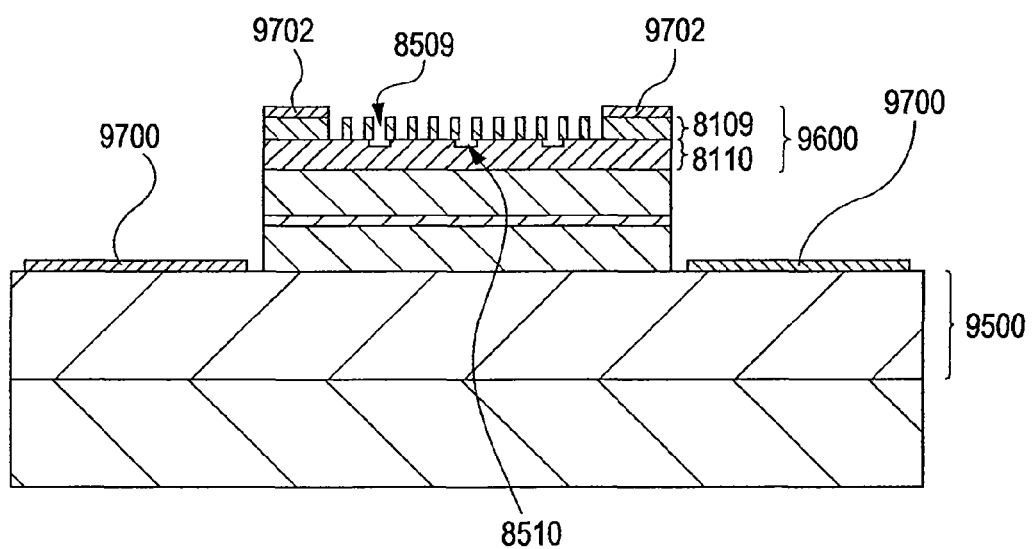
FIG. 19 is a conceptual cross-sectional view of the two-dimensional photonic crystal surface emitting laser.

FIG. 19 is a conceptual cross-sectional view of the two-dimensional photonic crystal surface emitting laser produced in this embodiment. In this structure, etching for forming posts is performed with a reactive ion beam etching system, and cathodes 9700 and anodes 9702 are then formed. In this embodiment, the resonator includes a DBR mirror layer 9500 composed of a laminate of GaN/AlGaN and a two-dimensional photonic crystal mirror 9600 having a periodic defect, but the present invention is not limited to this structure.

The surface emitting laser according to the present invention can be used as a light source in the industrial fields such as an optical communication technology, an electrophotographic technology, a display device technology, and a mass storage medium.

Although exemplary embodiments of this invention have been described in detail above, those skilled in the art will be readily appreciated that many modifications are possible in the exemplary embodiments without materially departing from the novel teachings and advantages of this invention. Accordingly, all such modifications are intended to be included within the scope of this invention. The scope of the following claims is to be accorded the broadest interpretation so as to encompass all modifications, equivalent structures and functions.

This application claims the benefit of Japanese Application No. 2005-131643 filed Apr. 28, 2005, No. 2005-130718 filed Apr. 28, 2005, No. 2006-052935 filed Feb. 28, 2006 and No. 2005-233776 filed Aug. 11, 2005, which are hereby incorporated by reference herein in their entirety.

What is claimed is:

1. A surface emitting laser device comprising:
    a first reflective mirror;
    a second reflective mirror having a periodic-refractive-index structure in which the refractive index periodically changes in the in-plane direction of a plane opposing the first reflective mirror; and
    an active layer disposed between the first reflective mirror and the second reflective mirror,
    wherein the periodic-refractive-index structure includes a plurality of parts that disorder the periodicity of the periodic-refractive-index structure of the second reflective mirror, and
    wherein the periodic-refractive-index structure is structured such that light incident on the periodic-refractive-index structure in the perpendicular direction to the in-plan direction of the periodic-refractive-index structure causes resonance in the in-plane direction and the light is emitted in the direction perpendicular to the in-plane direction,
    wherein the second reflective mirror comprises a plurality of layers each having a periodic-refractive-index structure.

2. The surface emitting laser device according to claim 1, wherein the periodic-refractive-index structure is a two-dimensional photonic crystal structure.

3. The surface emitting laser device according to claim 2, wherein a defect level is present within a photonic bandgap of the two-dimensional photonic crystal structure corresponding to the parts that disorder the periodicity of the periodic-refractive-index structure.

4. The surface emitting laser device according to claim 1, wherein the parts that disorder the periodicity of the periodic-refractive-index structure are positioned periodically or aperiodically in the in-plane direction of the second reflective mirror.

5. The surface emitting laser device according to claim 1, wherein the parts that disorder the periodicity of the periodic-refractive-index structure include light-emitting parts that are optically coupled with each other, wherein the vertical cavity surface emitting laser device emits light in the single transverse mode.

6. The surface emitting laser device according to claim 1, wherein the first reflective mirror, the active layer, and the second reflective mirror having the periodic-refractive-index structure are disposed on a substrate in that order and the first reflective mirror comprises a multilayer film.

7. The surface emitting laser device according to claim 1, wherein the second reflective mirror, the active layer, and the first reflective mirror are disposed on a substrate in that order and the first reflective mirror comprises a multilayer film.

8. The surface emitting laser device according to claim 1, wherein the first reflective mirror, the active layer, and the second reflective mirror having the periodic-refractive-index structure are disposed on a substrate in that order and both the first reflective mirror and the second reflective mirror comprise a two-dimensional photonic crystal.

9. The surface emitting laser device according to claim 1, wherein the first reflective mirror, the active layer, the second reflective mirror having the periodic-refractive-index structure, and an electrode are disposed on a substrate in that order and the periodic-refractive-index structure is not provided in a part of the second reflective mirror disposed directly under the electrode.

10. The surface emitting laser device according to claim 1, wherein the first reflective mirror is a distributed Bragg reflector mirror comprising a multilayer film.

11. The surface emitting laser device according to claim 1, wherein the periodic-refractive-index structure comprises a two-dimensional photonic crystal and the parts that disorder the periodicity are defects.

12. A surface emitting laser device comprising:
    a first reflective mirror;
    a second reflective mirror having a periodic-refractive-index structure in which the refractive index periodically changes in the in-plane direction of a plane opposing the first reflective mirror; and
    an active layer disposed between the first reflective mirror and the second reflective mirror, wherein the periodic-refractive-index structure includes a plurality of parts that disorder the periodicity of the periodic-refractive-index structure of the second reflective mirror, and wherein the periodic-refractive-index structure is structured such that light incident on the periodic-refractive-index structure in the perpendicular direction to the in-plan direction of the periodic-refractive-index structure causes resonance in the in-plane direction and the light is emitted in the direction perpendicular to the in-plane direction, wherein the periodic-refractive-index structure comprises a first medium and a second medium, the second medium having a refractive index higher than that of the first medium, and wherein the device further comprises a layer comprising a medium having a refractive index lower than that of the second medium disposed between the second reflective mirror having the periodic-refractive-index structure and the active layer.

13. A surface emitting laser device comprising:

a first reflective mirror;

a second reflective mirror having a periodic-refractive-index structure in which the refractive index periodically changes in the in-plane direction of a plane opposing the first reflective mirror; and an active layer disposed between the first reflective mirror and the second reflective mirror, wherein the periodic-refractive-index structure includes a plurality of parts that disorder the periodicity of the periodic-refractive-index structure of the second reflective mirror, and wherein the periodic-refractive-index structure is structured such that light incident on the periodic-refractive-index structure in the perpendicular direction to the in-plan direction of the periodic-refractive-index structure causes resonance in the in-plane direction and the light is emitted in the direction perpendicular to the in-plane direction, wherein the interval between the parts that disorder the periodicity of the periodic-refractive-index structure is set so that the parts that disorder the periodicity serve as light-emitting parts and light components in each of the parts that disorder the periodicity are coupled with each other.

14. A surface emitting laser device comprising:

a first reflective mirror;

a second reflective mirror having aperiodic-refractive-index structure in which the refractive index periodically changes in the in-plane direction of a plane opposing the first reflective mirror; and an active layer disposed between the first reflective mirror and the second reflective mirror, wherein the periodic-refractive-index structure includes a plurality of parts that disorder the periodicity of the periodic-refractive-index structure of the second reflective mirror, and wherein the periodic-refractive-index structure is structured such that light incident on the periodic-refractive-index structure in the perpendicular direction to the in-plan direction of the periodic-refractive-index structure causes resonance in the in-plane direction and the light is emitted in the direction perpendicular to the in-plane direction, wherein the periodic-refractive-index structure comprises a first area in which the parts that disorder the periodicity are disposed and a second area in which the parts that disorder the periodicity are not disposed, and the second area is positioned so as to surround the first area.

15. The surface emitting laser device according to claim 14, wherein the first area comprises a square lattice and the second area comprises a triangular lattice.

16. A surface emitting laser device comprising:

a first reflective mirror;

a second reflective mirror having a periodic-refractive-index structure in which the refractive index periodically changes in the in-plane direction of a plane opposing the first reflective mirror; and an active layer disposed between the first reflective mirror and the second reflective mirror, wherein the periodic-refractive-index structure includes a plurality of parts that disorder the periodicity of the periodic-refractive-index structure of the second reflective mirror, and wherein the periodic-refractive-index structure is structured such that light incident on the periodic-refractive-index structure in the perpendicular direction to the in-plan direction of the periodic-refractive-index structure causes resonance in the in-plane direction and the light is emitted in the direction perpendicular to the in-plane direction, wherein an energy level of a plurality of parts that disorder the period is positioned within 50% from the center of a photonic bandgap of the periodic-refractive-index structure in a range between the center and the band edge of the photonic bandgap.

* * * * *